United States Patent
Booth et al.

(10) Patent No.: US 6,365,912 B1
(45) Date of Patent: Apr. 2, 2002

(54) SUPERCONDUCTING TUNNEL JUNCTION DEVICE

(75) Inventors: Norman Ewart Booth, Oxford (GB); Joel Nathan Ullom; Michael Nahum, both of Cambridge, MA (US)

(73) Assignee: Isis Innovation Limited, Oxford (GB)

(*) Notice: Subject to any disclaimer, the term of this patent is extended or adjusted under 35 U.S.C. 154(b) by 0 days.

(21) Appl. No.: 09/719,796

(22) PCT Filed: Jun. 16, 1999

(86) PCT No.: PCT/GB99/01920

§ 371 Date: Mar. 6, 2001

§ 102(e) Date: Mar. 6, 2001

(87) PCT Pub. No.: WO99/66567

PCT Pub. Date: Dec. 23, 1999

(30) Foreign Application Priority Data

Jun. 17, 1998 (GB) .............................. 9813108
Mar. 31, 1999 (GB) .............................. 9907460

(51) Int. Cl.⁷ ..................... H01L 29/06; H01L 39/00; H01L 39/22

(52) U.S. Cl. ..................... 257/39; 257/30; 257/32; 257/36

(58) Field of Search ................ 257/39, 36, 30, 257/31, 32, 33, 34, 35; 505/163, 873, 874; 29/25.01, 367

(56) References Cited

U.S. PATENT DOCUMENTS

| | | | |
|---|---|---|---|
| 4,157,555 A | 6/1979 | Gray | 257/36 |
| 4,334,158 A | 6/1982 | Faris | 326/2 |
| 4,423,430 A * | 12/1983 | Hasuo et al. | 326/3 |
| 4,575,741 A | 3/1986 | Frank | 257/39 |
| 5,306,927 A * | 4/1994 | Dalrymple et al. | 257/38 |
| 5,318,952 A * | 6/1994 | Hato | 505/193 |

FOREIGN PATENT DOCUMENTS

| | | |
|---|---|---|
| EP | 0 081 007 | 6/1983 |
| EP | 0 144 217 | 6/1985 |
| EP | 0 163 031 | 12/1985 |
| GB | 996762 | 6/1965 |
| GB | 1002591 | 8/1965 |

* cited by examiner

Primary Examiner—Steven Loke
Assistant Examiner—Shouxiang Hu
(74) Attorney, Agent, or Firm—Nixon & Vanderhye

(57) ABSTRACT

A superconductive tunnel junction device in which quasi-particles in a superconductive region ($S_1$), relax into a normal metal trap ($N_1$) releasing their potential energy in electron-electron interactions to increase the number of excited charge carriers in the trap. The excited charge carriers tunnel through an insulating tunnel junction barrier ($I_2$) into a second superconductive region ($S_2$). The quasi-particles in the first superconductive region are formed either by absorption or energetic particles/radiation or by injection by charge carriers tunneling in from a base region which can be of normal metal ($N_0$) or superconductor (or both) of semiconductor. The current from the trap to the second superconductor is higher than that out of the base region thus providing current amplification. The device can thus form a three terminal transistor-like device. It can be used as or in particle/radiation detectors, as an analogue signal amplifier, microrefrigerator or digital switch.

26 Claims, 14 Drawing Sheets

SUPERCONDUCTING TUNNEL JUNCTION DEVICE

BACKGROUND OF THE INVENTION

The present invention relates to a superconductive tunnel junction device which is capable of both current and voltage amplification of low-level signals.

The search for a superconductive 3-terminal device with amplifying capability and good isolation of the input from the output has been in progress for more than 20 years. The advantages of superconductive electronics over semiconductor electronics are in two broad areas: digital applications based on the high switching speed and low power dissipation of Josephson junctions, and analog applications based on extremely high sensitivity and response to electromagnetic phenomena over a very wide frequency spectrum. This spectrum ranges from dc and low frequency magnetic fields (where SQUID devices are used), to microwaves and mm waves, infrared, optical, and UV radiation, through to the detection and spectroscopy of X-rays and $\gamma$-rays. Also lowering the temperature of electronic circuitry tends to reduce its inherent noise. However, without a complementing 3-terminal transistor-like device, these advantages are limited to very specialised applications. In the immediate future, particularly in the application of superconducting photon counting spectrometers to astrophysics, many detector pixels and analogue electronics channels will be required.

In order to exploit these advantages a 3-terminal transistor-like device should fulfil a stringent list of properties including:

current gain;
voltage gain;
isolation between input and output;
high speed;
potential for very large scale integration (VLSI);
low power,
impedances compatible with other devices and with transmission lines;
manufacturability.

For ease of digital design 3-terminal devices should also be inverting and non-latching.

At least three different devices based on non-equilibrium superconductivity and quasiparticle dynamics have been proposed and studied: the Gray effect transistor, the Quiteron, and the quasiparticle multiplier. Each of these will be described briefly below but all of these devices utilise quasiparticle tunnelling.

The Gray effect transistor is described in U.S. Pat. No. 4,157,555 and relies on the fact that there are two tunnelling processes (and their inverses) for quasiparticles in superconductor-insulator-superconductor (SIS) junctions, and under certain conditions multiple tunnelling can occur. The Gray effect transistor is formed by disposing three thin films of superconductive material in a planar parallel arrangement and insulating the films from each other by layers of insulating oxides to form two tunnel junctions. One junction is biased above twice the superconductive energy gap and the other is biassed at less than twice the superconductive energy gap. Injection of quasiparticles into the centre film by one junction provides a current gain in the second junction.

This multiple tunnelling effect when combined with quasiparticle trapping has been used to amplify low-level signals from the absorption of single X-ray quanta. More recently the same scheme with multiple tunnelling amplification factors of up to about 200 has been used to count and measure the energy of individual optical quanta. Although this amplification scheme has proven to be extremely useful, it produces charge amplification, not current amplification, that is to say the length of the current pulses is extended, not their amplitude.

The Quiteron is described in EP-A1-0081007 and produces gain by suppression of the energy gap $\Delta$ of the central electrode of a double SIS tunnel junction structure. In this device the superconductive energy gap of the central superconductive layer is greatly altered by over-injection of energetic quasiparticles so that the energy gap changes greatly with respect to its thermal equilibrium value, and in most cases is made to vanish. In one example of this device a three electrode device is constructed with tunnel barriers between the electrodes. A first of the tunnel junctions is used to heavily inject energetic quasiparticles into the central superconductive electrode to change its superconductive energy gap drastically. In turn, this greatly modifies the current-voltage characteristics of the second tunnel junction. This device appeared initially to be very promising, but never fulfilled all of the requirements for either analog or switching devices, particularly that of isolation of the input from the output. This problem can be visualised using the two-fluid (Landauer) model of transistor-like operation in which a 3-terminal device is viewed in analogy with a fluid-actuated "piston" in which a "control" fluid controls the flow of a second "moving" fluid. For proper operation it is important that the fluids be separate with little mixing between them. For bipolar transistors a small base current controls a much larger collector current and changes in the output have little effect on the input. Similar features apply to most other semiconductor 3-terminal devices. However, for the Quiteron the central superconductive electrode is shared between input and output with only a small degree of unidirectionality. Such a device is not very useful. Moreover, the gap suppression requires a large deviation from equilibrium.

The quasiparticle multiplier [N E Booth "Quasiparticle trapping and the quasiparticle multiplier", Appl. Phys. Lett. 50, 293 (1987)] makes use of the quasiparticle trapping scheme. Like the Quiteron it consists of (a minimum of) three superconductive films separated by tunnelling barriers. The central film is a bilayer of two superconductors, a primary film S1 of energy gap $\Delta 1$ and a trapping film S2 of energy gap $\Delta 2$. If $\Delta 2$ is less than one third of $\Delta 1$, additional quasiparticles can be produced by phonons emitted in the trapping process where a quasiparticle diffusing from S1 into S2 relaxes to the lower energy gap. In contrast to the Quiteron, there is a high degree of directionality. Although, as originally proposed, several stages can be cascaded like a photomultiplier, the gain per stage for Nb—Al films is not more than 3, and this value is obtained only if all relaxation phonons are absorbed in the trap, which is highly unlikely.

It should also be said that all three of the devices above require the application of a small magnetic field to suppress Josephson effects.

Other devices which may have specific applications, such as devices based on vortex flow, have also been proposed and studied. Very recently a new device based on controlling a supercurrent by the current through a normal metal film has been proposed A F Morpurgo, T M Klapwijk and B J van Wees, "Hot Electron Tunable Supercurrent", Appl. Phys. Lett. 72, 966 (1998)

Thus the need for a satisfactory superconductive transistor-like device has still not been met.

SUMMARY OF THE INVENTION

The present invention provides a device in which quasiparticles travelling from a superconductive region with energy gap Δ to a normal region lose their potential energy in electron-electron interactions to increase the number of excited electrons in the normal region above the equilibrium thermally excited number. This increase is the basis for current amplification. The same effect can occur with holes. In the following, the term charge carriers will be used to refer to electrons or holes.

In more detail, according to the present invention there is provided a superconductive tunnel junction device comprising a first superconductive region in contact with a first normal region, wherein the potential energy of quasiparticles from the first superconductive region relaxing into the first normal region is converted into an increased number of charge carriers excited above the Fermi level of the first normal region.

The device may further comprise a second superconductive region separated from the first normal region by an insulating tunnel barrier to form a tunnel junction, across which the charge carriers tunnel into the second superconductive region to form quasiparticles therein. This second superconductive region can form an electrode of the device.

The second superconductive region and the first normal region may be biassed relative to one another so that the energy gap of the second superconductive region is near the Fermi level of the first normal region.

Thus the first normal (conductivity) region acts as a trap for quasiparticles from the first superconductive region and when the quasiparticles enter the trap they relax and their potential energy is converted into kinetic energy of the charge carriers in the normal trap. This normal trap is arranged to act as the normal electrode of a tunnel junction which is an NIS (normal, insulator, superconductor) junction. Because of the transfer of energy from the relaxing quasiparticles, the number of charge carriers in the normal trap is increased above the equilibrium number created by thermal excitation and this is the basis of the current amplification. It should be noted that although normal trap regions have been used previously to dissipate the energy of quasiparticles from a superconductive electrode, in the present invention the energy is not dissipated but is used to excite charge carriers in the normal trap which thereby form an amplified current.

An important feature of the superconductive device is the existence of an energy gap in the first superconductive region so that the potential energy Δ of quasiparticles in the first superconductive region is converted into the excitation of charge carriers which, in turn, form for the second superconductive region a tunnelling current which flows only when there are excited charge carriers in the normal metal trap.

The quasiparticles in the first superconductive region can be created directly therein by incident radiation or particles (e.g. nuclear particles) when the device is being used as a detector, or can be injected via a tunnel junction from a "base" region. (The terms "base", as well as "emitter" and "collector" will be used in analogy with the bipolar transmitter though, obviously, the physical principals of operation are different). The base region can comprise a second normal region separated from the first superconductive region by an insulating tunnel barrier. The base region is electrically biassed so that charge carriers excited above the Fermi level tunnel through the tunnel barrier to form quasiparticles in the first superconductive region. Thus the device has an N-I-SN-I-S structure. The amplifying effect can be understood by comparing the number of excited charge carriers in the first normal region (the trap) compared to the second normal region (the base). In the base the number of excited charge carriers is simply the equilibrium thermally excited number. However in the trap that number is increased by the energy from the relaxing quasiparticles from the first superconductive region. That increased number represents an amplification.

In the N-I-SN-I-S device described above with a normal base region, the first normal region can form the emitter electrode and the second superconductive region the collector electrode, thus producing a device analogous to a bipolar transistor.

In alternative embodiments the base region can comprise a superconductive region in which case the base-emitter junction acts as a Josephson junction, or the Josephson current therein can be suppressed by the application of a small magnetic field. Another alternative is for the base region to be a semiconducting flim, e.g. for use as a radiation detector.

The N-I-SN-I-S device described above can be modified by the normal base region carrying a further superconductive region in intimate contact with it so that the base normal film acts as a trap for quasiparticles generated in the further superconductive region. Such a device can be used, again, as a radiation detector, particularly for X-rays or a phonon detector.

The collector region (second superconductor) is electrically biassed relative to the emitter region (first normal region) so that the top of the energy gap is just above the Fermi level of the emitter to allow tunnelling of the charge carriers. Similarly, where a base region is provided, the base and emitter are relatively biassed similarly to place the top of the energy gap of the first superconductive region just above the Fermi level to allow tunnelling of the charge carriers.

Although the second superconductive region can itself form the collector electrode, it is also possible to provide a further normal region in contact with it for acting as a trap for quasiparticles from that region. That normal region then forms the electrical and thermal contact of the collector electrode.

In the above devices the base-emitter junction or the collector-emitter junction can be divided into two or more parallel junctions to provide adding circuits, fan-out circuits or double collector circuits.

As for the materials used in the device, the superconductor can be any superconductive material e.g. niobium, niobium nitride or aluminium and the normal regions can be regions of metal-like conductivity, e.g. metals such as molybdenum, tungsten, magnesium, calcium, copper, palladium, silver or gold. The superconductive materials, particularly where aluminium is used, may be impure or disordered to reduce the superconducting coherence length. Of course, high-temperature superconductors or organic superconductors can be used.

The device can be used as an analog electrical signal amplifier or as a digital switching device in analogous manner to a semiconducting transistor. It can also be used as a detector for a wide variety of particles/radiation, such as nuclear particles, photons, X-rays, phonons, bimolecular ions or dust particles. Thus it can be used in conjunction with various instruments e.g. mass spectrometer, scanning electron microscope.

The device can also be used as a microrefrigeration device because the removal of "hot" charge carriers from the base region results in electronic cooling of that region. The cooling effect can be increased by the use of two or more devices to cool the same base region.

It should be understood that the device can be biassed so that the charge carriers tunnelling from the normal regions into the superconductors are either electrons or holes.

It will be appreciated, therefore, that the device of the present invention can perform a wide variety of functions and also possesses all of the properties required of a superconducting three-terminal device. It is possible to realise output characteristics equivalent to both the pnp and npn bipolar transistors from the same device, simply by reversing the bias polarities. Also two complementary devices can easily be realised which do not exist in the semiconductor field, namely devices with negative current gain. In contrast to the Quiteron the influence on the input of changes in the output are minimal, thus it has good input-output isolation. The device can also easily be merged with Josephson junction circuits because, unlike the three non-equilibrium devices mentioned in the prior art discussion above, no magnetic field is needed to suppressed Josephson effects. The device can be arranged to accept optically coupled inputs with high sensitivity.

A particular advantage is that it is highly resistant to radiation damage. This makes the device useful in hostile environments such as nuclear reactors or accelerators or space (e.g. aboard satellites).

BRIEF DESCRIPTION OF THE DRAWINGS

The invention will be further described by way of non-limitative example with reference to the accompanying drawings in which.

DESCRIPTION OF THE INVENTION

The operation of a frist embodiment of the invention will now be described with reference to FIG. 1. For simplicity, it will be described with reference to quasi-electron tunnelling, though as explained below reversing one or both of the bias polarities gives analogous devices in which holes tunnel to form quasi-holes in superconductive regions.

It is based on a bilayer consisting of a superconductor $S_1$ with energy gap $\Delta_1$ in metallic contact with a normal metal $N_1$. Quasiparticles travelling from $S_1$ into $N_1$ by diffusion or ballistic transport release their potential energy $\geq \Delta_1$ by increasing the number of excited electrons (and holes) above the equilibrium thermally excited number. This increase in the number of charge carriers above the Fermi level is the basis for current amplification when the trap $N_1$ is also used as the N electrode of a normal-insulator-superconductor (NIS) junction.

Figure 1:
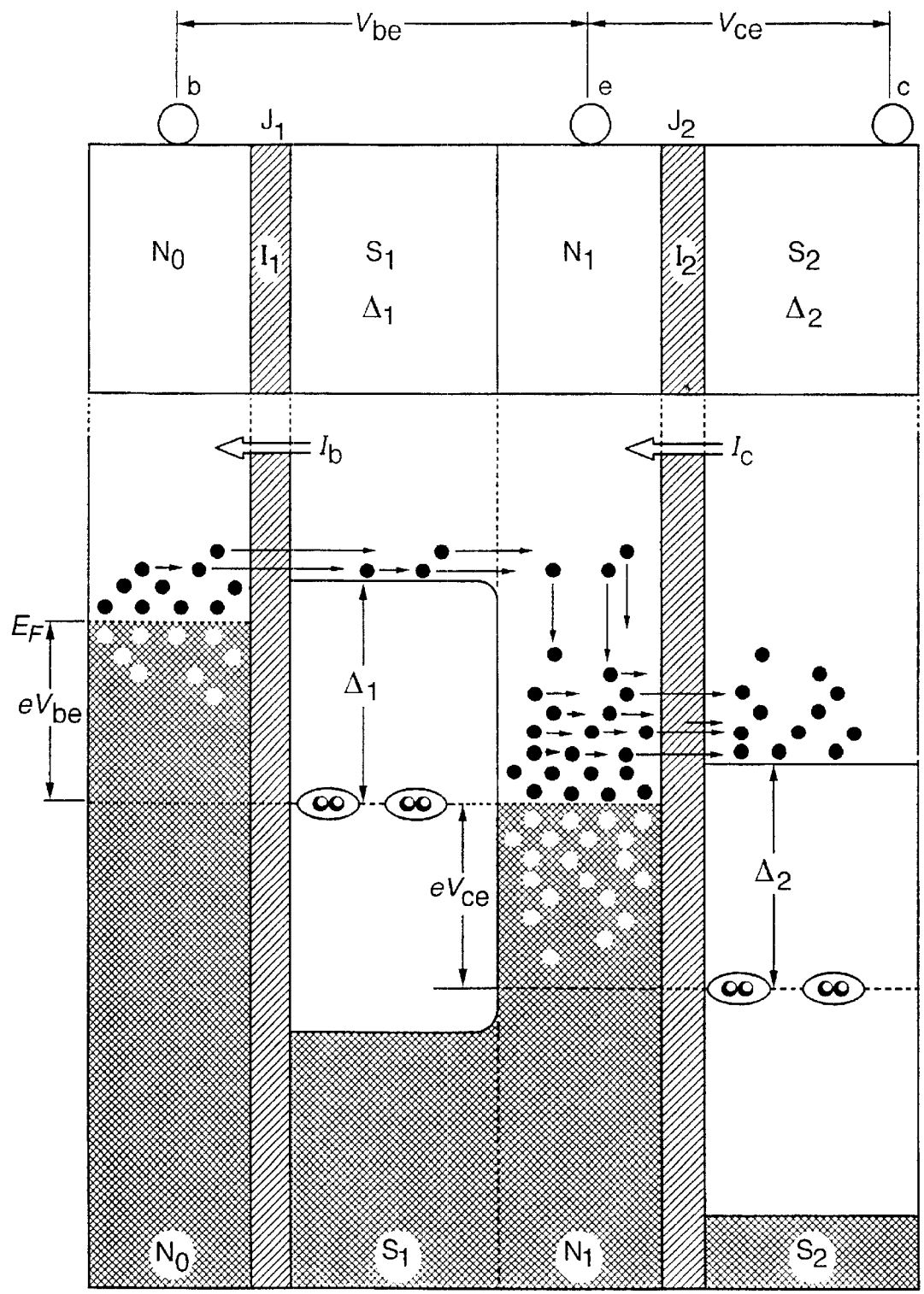
FIG. 1 schematically shows a first embodiment of the invention together with the energy levels associated with the different parts of the device.

As illustrated schematically in the upper part of FIG. 1 the input stage consists of an NIS tunnel junction $J_1$ consisting of normal metal region $N_0$, an insulating tunnel barrier $I_1$, followed by a superconductive region $S_1$. A normal-metal quasiparticle trap $N_1$ is attached to the superconductive region $S_1$. This normal metal trap $N_1$ is arranged to act as the normal-metal electrode of a second junction $J_2$ ($N_1I_2S_2$) formed by an insulating tunnel barrier $I_2$ and a further superconductive region $S_2$. Junctions $J_1$ and $J_2$ may be considered respectively as 'injector' and 'acceptor' in analogy with the Quiteron. The symbol O indicates an electrical contact. In general, the contacts should be superconductive but this is not essential. They are labelled b, e, c in analogy to the labels for base, emitter, and collector connections for bipolar transistors.

The operation of this device can be understood by referring also to the electron energy level diagram in the lower part of FIG. 1. The filled (shaded) and empty electron states in the superconductors and normal metals are indicated with energy plotted vertically. Also indicated are electrons excited above the Fermi level and the companion hole states. Most of the valence electrons in the superconductors are in the form of Cooper pairs at the Fermi level as indicated by the conventional symbol. At any operating temperature T some of the electrons in $N_0$ are thermally excited to states above the Fermi level $E_F$ leaving corresponding hole states below $E_F$. (The number of excited electrons may be increased by a number of methods, for example injection of energetic electrons or the absorption of radiation in the $N_0$ electrode.) Electrons in $N_0$ which have energy greater than the difference between $\Delta_1$ and $eV_{be}$, where e is the electronic charge and $V_{be}$ is the bias voltage across the contacts b and e, can tunnel through the insulating tunnelling barrier $I_1$ and become quasiparticles in the $S_1$ layer. This has a cooling effect on the electrons in the $N_0$ electrode. This cooling effect of $N_0$ is important when $N_0$ is used as a radiation or phonon detector, and when the device is used as a two-stage microrefrigeration device. However, when the device is considered as a circuit element this cooling of $N_0$ can be neglected. Each quasiparticle injected into $S_1$ has a potential energy which is $\geq \Delta_1$. When the quasiparticles reach the normal metal region $N_1$ by diffusion or ballistic transport they relax by releasing their potential energy. In accordance with the present invention this energy is released by sharing with other electrons in the normal metal region $N_1$, thus heating the electronic system in $N_1$ (electron-electron interaction), and not by releasing phonons which can escape the trap and heat up the overall structure (electron-phonon interaction). Therefore, there is an increase in the mean number of electrons above the Fermi level in $N_1$ and a corresponding increase in the number of holes. Provided $N_0$ and $N_1$ are at similar temperatures there will be a number $<n>$ of electrons excited to energy approximately $k_B T$ for each trapped quasiparticle, where $k_B$ is the Boltzmann constant. The normal metal region $N_1$ is now used as the normal metal electrode of the second junction $N_1 I_2 S_2$. This second junction will have a higher current than the first because it has a factor $<n> \sim \Delta_1/k_B T$ more "hot" electrons in its normal metal electrode $N_1$. Thus, there is an amplifying effect with a current gain to first order of $\Delta_1/k_B T$. Since electrical currents are continuous, the excited tunnelling electrons are replaced by electrons at the Fermi level injected into the e contact from the power supply.

In terms of the two-fluid model, the "control" fluid is the base-emitter current i.e. the current from $N_0$ to $N_1$, the "piston" is the effective electron temperature $T_e$ of the emitter electrode $N_1$, and the "moving" fluid is the collector current, i.e. the current from $N_1$ to $S_2$ which is a strong function of $T_e$. Back mixing whereby temperature changes of the electrons in $N_1$ produce temperature changes of the electrons in $N_0$ can occur only very indirectly which means that the output is quite well isolated from the input.

Figure 8:
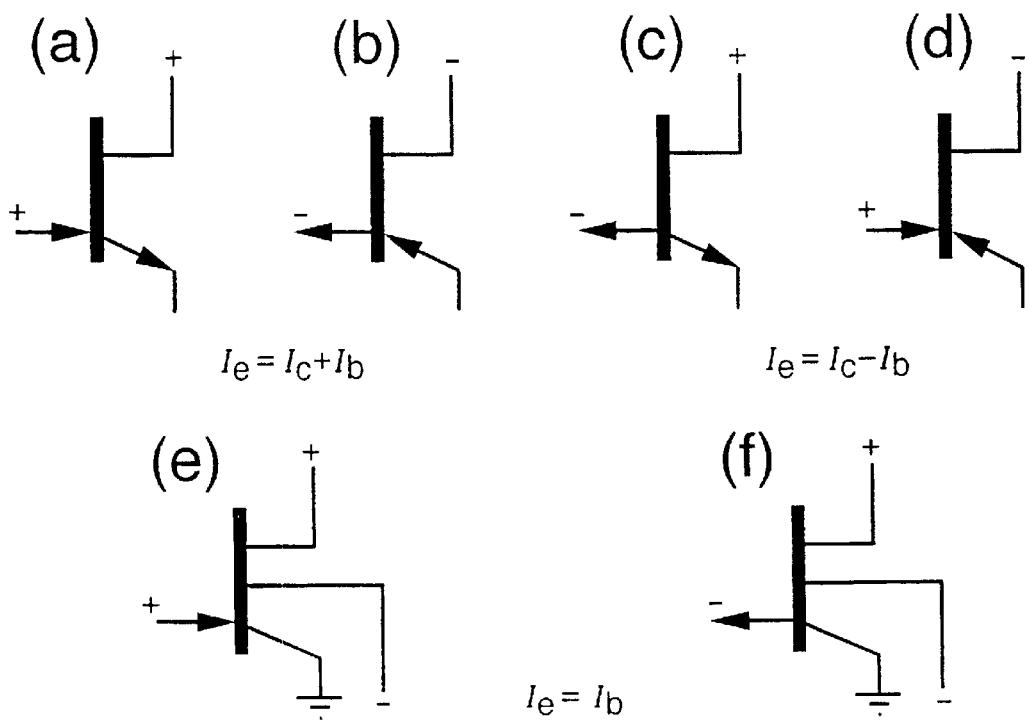
FIG. 8 shows schematically different types of embodiment of the invention.

The analogy with the bipolar transistor or with the field effect transistor is not exact. In the convention for describing semiconductor devices, where bias polarities and current flows are defined relative to the emitter, the device of FIG. 1 with the bias voltages $V_{be}$ and $V_{ce}$ as illustrated has negative current gain. This device is described symbolically by FIG. 8(c). If both bias polarities are reversed, we have the device of FIG. 8(d) which also has negative current gain. These devices have no semiconductor transistor counterparts. The devices of FIG. 8(a) and (b) which have one bias polarity reversed from (c) or (d) have positive current gains and most closely resemble the npn and pnp bipolar transistors respectively.

Figure 9:
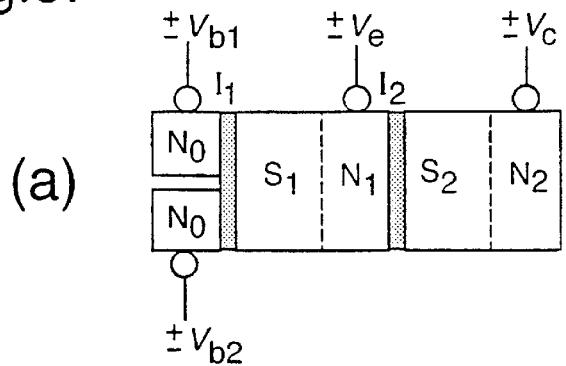
FIG. 9 shows further embodiments of the invention: (a) two separate base-emitter junctions for adder applications; (b) two separate emitter-collector junctions; and (c) a double-collector arrangement which doubles the output voltage swing.
Figure 9:
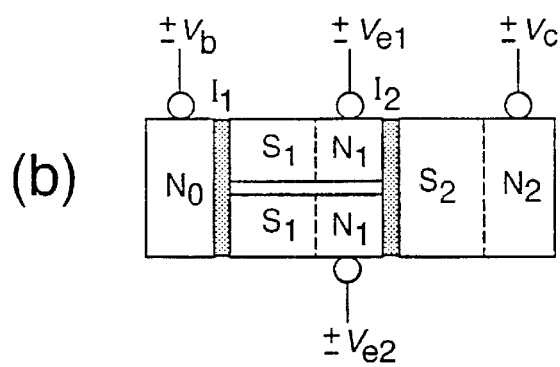
Figure 9:
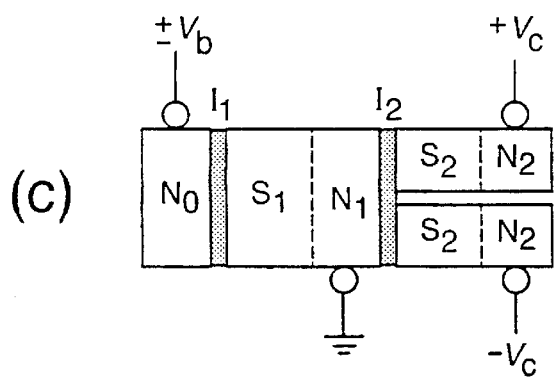

It is also possible to split any of the three electrodes to make two or more parallel junctions. This can be done with the base electrode to make an adder circuit as shown schematically in FIG. 9(a), with the emitter electrode as shown in FIG. 9(b), or with the collector electrode to make a fan-out circuit. Such circuits may have certain applications, but are probably not too useful because the parallel junctions are not isolated very well from each other. A much more useful device could be the device with a double collector junction with the two outputs (of equal junction area) in series, as shown symbolically in FIG. 8(e) and (f) and whose physical structure is shown schematically in FIG. 9(c). These devices have half the current gain of a single collector device but twice the voltage gain. Although the emitter is shown connected to earth, this need not be the case: its bias voltage should just be half way between the two collectors.

A further normal metal trap $N_2$ can be fabricated on the second superconductive region $S_2$ and this can be used as the input electrode for one or more further cascaded stages.

The dc operation of the device will now be explained, again referring to the embodiment and energy level diagram shown schematically in FIG. 1.

The relation between current $I_{NIS}$ voltage V and temperature T for either junction is given by the known approximate NIS expression:

$$I \equiv \frac{I_{NIS} R_{NN}}{\Delta/e} \approx [2\pi Z]^{1/2} e^{-1/Z} \left[ \frac{e^{Y/Z} - e^{-Y/Z}}{2} \right], \ |Y| < 1 \quad (1)$$

Here the current is also written in a normalised form I in units of $(\Delta/e)R_{NN}$, where $R_{NN}$ is the normal state resistance of the junction, and in terms of the normalised variables:

$$Y = V/(\Delta/e) \text{ and } Z = T/(\Delta/k_B) \quad (2)$$

For $|Y|<1$ the forward characteristic is an exponential, similar to that of the pn junction; however, in contrast to a semiconductor pn junction the reverse characteristic is the asymmetric partner of the forward characteristic. In FIG. 1 most of the quasiparticles in $S_1$ enter the trap $N_1$ and relax to near the Fermi level of $N_1$ by giving up their potential energy $\bar{\epsilon}_1 \approx \Delta_1$. In the quasiparticle multiplier, which involved a superconductive trap, this relaxation occurred by phonon emission. However, in the present invention this relaxation occurs mainly via the electron-electron (e-e) interaction rather than the electron-phonon (e-p) interaction. The desired result is that the energy of the trapped quasiparticles heats up the electron system in the trap and is not lost by phonon emission (which will largely escape the trap and heat up the whole structure). The desired result is likely to occur for a normal-metal trap which has lots of free electrons which can be excited, whereas in a superconductive trap most of the electrons are bound in Cooper pairs and an energy of $2\Delta$ is needed to produce two excited electrons. For instance, for a superconducting aluminum film at temperatures in the range 35–250 mK, with an adjoining trapping film of normal-metal silver, the quasiparticles transfer more than 80% of their energy to conduction electrons in the silver and for a superconductive aluminium film at 100 mK, with an adjoining trapping film of normal-metal silver, the quasiparticles transfer more than 90% of their energy to conduction electrons in the silver. Taking an efficiency $\eta$ for this process, then a base current $I_b$ produces a power flow into $N_1$ given by $$P \approx \eta(I_b/e)\Delta_1 \quad (3)$$

Figure 2:
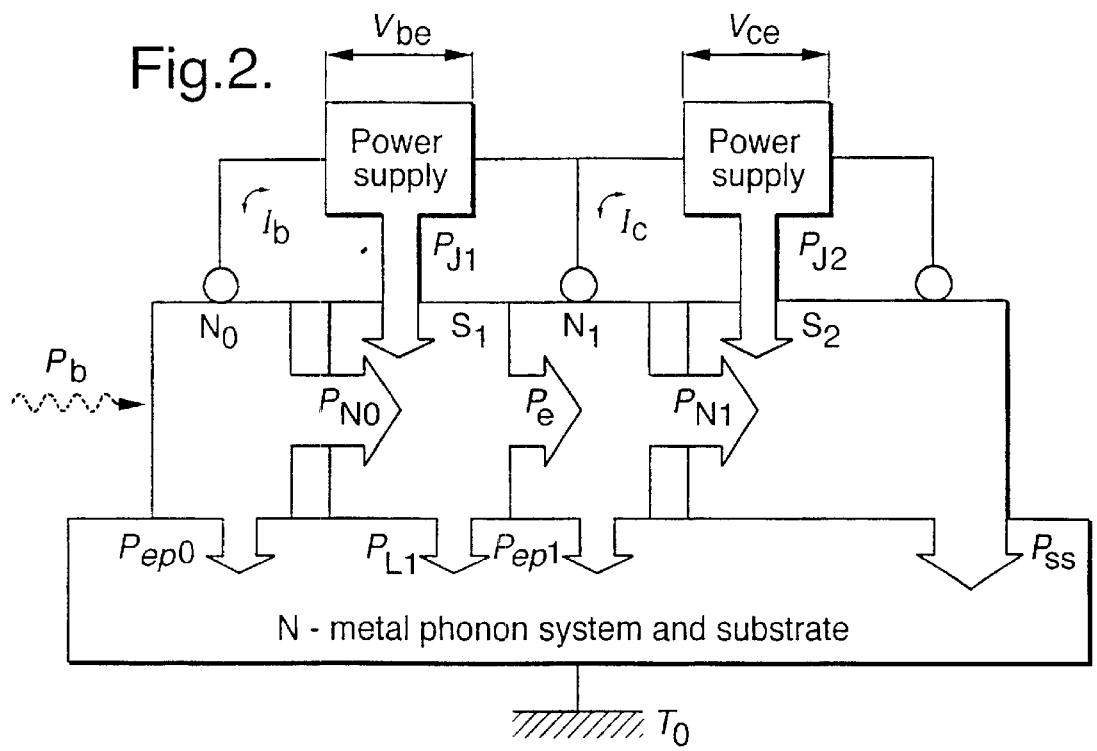
FIG. 2 schematically shows the electrical and thermal power flows in the device of FIG. 1.

FIG. 2 shows schematically the main routes of power flow in the device of FIG. 1. The power $P_b$ represents power flowing into the base electrode $N_0$ due to a signal excitation.

The Joule powers $P_{J1}=I_b V_{be}$ and $P_{J2}=I_c V_{ce}$ are dissipated in the phonon systems in the first and second superconductive regions $S_1$ and $S_2$ respectively. The power flow $P_e$ into the normal metal emitter electrode $N_1$ due to quasiparticle trapping is given by eq. (3) with the loss $P_{L1}$ being of the same form but with $\eta$ replaced by $(1-\eta)$. Of course the electrical currents are continuous: quasiparticles lost by recombination are replaced by Cooper pairs at the Fermi level and excited electrons tunnelling from the N layers are replaced by electrons at the Fermi level. As mentioned above, NIS tunnelling has the remarkable property of cooling the electrons in the normal metal electrode. The cooling powers due to tunnelling from the normal metal regions $N_0$ and $N_1$, shown as $P_{N0}$ and $P_{N1}$, are given by:

$$P_{N0} \approx (\overline{\epsilon}_1 - eV_{be})I_b/e \quad P_{N1} \approx (\overline{\epsilon}_2 - eV_{ce})I_c/e \qquad (4)$$

As mentioned previously we will for the most part neglect $P_{N0}$. There is also the possibility of Joule power dissipation in the $N_0$ and $N_1$ layers by the bias currents due to their finite electrical resistance. For the devices to be discussed below this was negligible.

The quantities $P_{ep0}$ and $P_{ep1}$ are the thermal power losses from the electron systems in the $N_0$ and $N_1$ electrodes to their respective phonon systems and thence to the substrate which is maintained at a temperature $T_0$. These thermal power losses can be written as:

$$P_{ep} = \Sigma \Omega_N (T_N^5 - T_0^5) \qquad (5)$$

for each normal metal electrode where $\Omega_N$ is the volume of normal metal at electron temperature $T_N$ and $\Sigma$ is a material-dependent quantity of value in the range 1–5 nW $\mu$m$^{-3}$ K$^{-5}$. In this expression we have assumed that the phonon temperature in the N electrodes is the same as the heat bath $T_0$. The extent to which this is a good approximation depends upon details of the geometry of the films and their coupling to the substrate.

Finally, the remaining power, shown as $P_{SS}$, should be dissipated in the substrate. This power resides mainly in the potential energy of the quasiparticles in $S_2$ which are at an energy $\overline{\epsilon}_2 \approx \Delta_2$. If this energy is lost mainly by quasiparticle recombination, the resulting $2\Delta$ phonons may leak back into the device and change the power flows. This effect can be minimised by making the second superconductive region $S_2$ a large area electrode such that the quasiparticles diffuse away from the junction before they recombine. Alternatively a normal metal film $N_2$ can be attached to the second superconductive region $S_2$ to act as a trap for the quasiparticles and a thermalizer as shown, for example, in the devices of FIGS. 9, 10, 12 and 13. This further normal metal film $N_2$ should be well-coupled to the substrate.

A more realistic approximate estimate of the current gain of the device than the $\Delta_1/k_B T$ which was obtained above will now be made.

Consider the power flows into and out of the emitter electrode $N_1$. Under dc conditions the net flow must be zero, which gives:

$$\eta \frac{I_b}{e} \overline{\epsilon}_1 - \Sigma \Omega_e (T_N^5 - T_0^5) \approx \frac{I_c}{e} (\overline{\epsilon}_2 - eV_{ce}) \qquad (6)$$

The first term is the power given up by the relaxing quasiparticles; the second is the thermal power loss mentioned above and the right hand side is the power flowing from emitter to collector. This is the basic equation which governs the operation of the device.

We will now consider two different limits of eq. (6). In some cases (for example for the device which is discussed below) the cooling power due to the collector current can be neglected. In this case, (A) the right-hand side (rhs) of eq. (6) is very small and the emitter electron temperature is found by setting the left-hand side (1 hs) equal to zero, which gives $$T_e = T_0 \left[ 1 + \frac{\eta(I_b/e)\overline{\epsilon}_1}{\Sigma A d T_0^5} \right]^{1/5} \qquad (7a)$$

The value of $I_c$ for this value of $I_b$ can then be found (for constant $V_{ce}$) by inserting this value $T_e$ into eq. (1).

Neglecting briefly the $P_{ep}$ term, gives (B)

$$I_c/I_b = \eta \overline{\epsilon}_1 (\overline{\epsilon}_2 - eV_{ce}) \approx \eta \Delta_1/(\Delta_2 - eV_{ce}) \qquad (7b)$$

In micro-refrigerator tests, bias voltages $eV/\Delta$ of 0.9 to 0.95 gave the best results, so current gains of 10–20 are feasible for $\Delta_1 \approx \Delta_2$.

Figure 3:
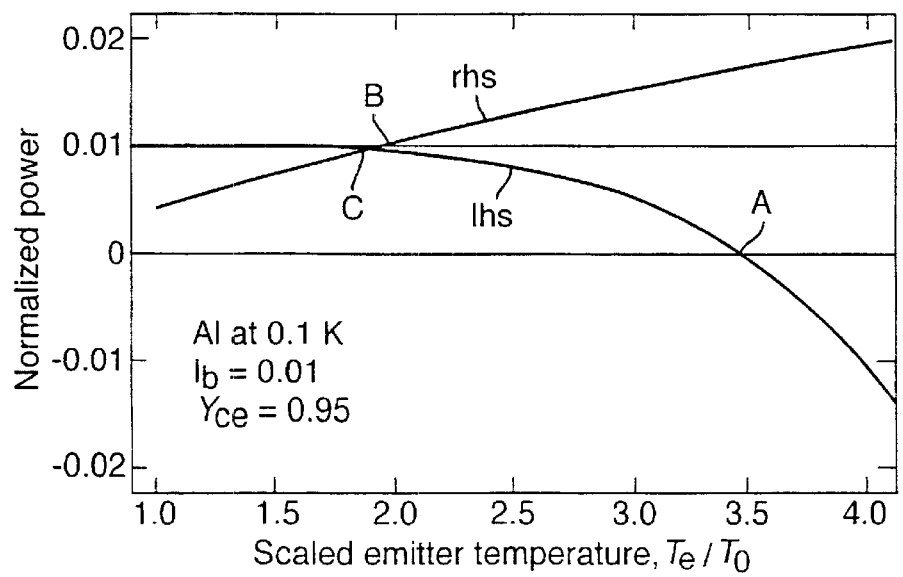
FIG. 3 is a graph illustrating the balance of power flows in the device of FIG. 1.

With the $P_{ep}$ term included, eq. (6) must be solved for an input current $I_b$ as a function of $I_c$, $V_{ce}$, and the electronic temperature of the emitter electrode $T_e$. Note that these three variables are related both by the power-balancing eq. (6) and by the collector I/V characteristic given by eq. (1). An example solution is shown in FIG. 3 where the two sides of eq. (6) are plotted as functions of the scaled emitter temperature $T_e/T_0$ where $T_0$ is the base temperature. The intersection is the operating point and gives the electronic temperature $T_e$ of the emitter and the magnitude of the power flow. Points A and B correspond to the limits (A) and (B) mentioned above.

According to this model an input current $I_b$ increases $T_e$ and, for fixed $V_{ce}$, the output current $I_c$ increases in magnitude for all polarity combinations of the two junctions. However there is no direct mechanism by which an increase in $I_c$ can produce a change in $I_b$. Thus, the isolation of the input from the output is high. A detailed model of phonon production and transport from $S_2$, $N_1$ and $S_1$ back to $N_0$, which depends strongly upon the geometrical arrangement, is necessary in order to estimate indirect coupling which is analogous to the voltage feedback ratio for transistors. The current gain can exceed unity when as illustrated in FIG. 1 the bias voltage $|V_{ce}|$ approaches $\Delta_2$. However, $|V_{ce}|$ must not exceed $\Delta_2$ appreciably because then both holes and electrons can flow with little dependence on the temperature of $N_1$.

Figure 5:
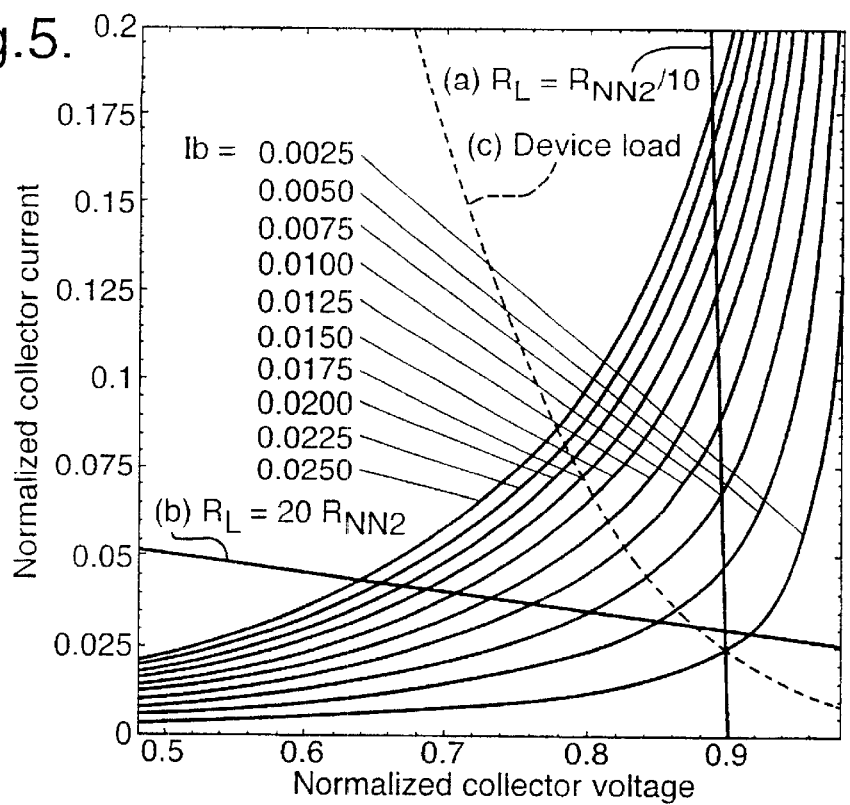
FIG. 5 is a graph illustrating the collector characteristics of the device of FIG. 1.

Examples of the collector characteristics are shown in FIG. 5 for $\Delta_1$, $\Delta_2$ and $T_0$ corresponding to A1 at 100 mK.

As shown, linear load lines can be chosen to give either (a) current gain at constant voltage bias, or (b) voltage gain at constant current bias (or any intermediate combination). For example, a change of normalised base current from 0.0025 to 0.0050 gives a change of normalised collector current of 0.021 along load line (a), corresponding to a current gain of 8.5 for $R_{NN1}=R_{NN2}$.

Although regions of linear operation are limited to resistor load lines, it can be seen that (c) using another device as the load can extend the region of linearity. The horizontal scale in FIG. 5 extends to $|Y_{ce}|=0.98$ and at this value the approximation of eg.(l) begins to deviate substantially from the exact formula below and over estimates the current by 40%.

$$I_{NIS} = \frac{1}{eR_{NN}} \int_\Delta^\infty \rho_S(\varepsilon)[f_N(\varepsilon - eV) - f_N(\varepsilon + eV)]d\varepsilon \qquad (A1)$$

There is a possibility that $S_1$ and $S_2$ are different superconductors by using $\overline{\epsilon}_1 \geq \Delta_1$ and $\overline{\epsilon}_2 \geq \Delta_2$ in eq. (6). It is also possible to arrange that the junctions have different normal-state resistances $R_{NN1}$ and $R_{NN2}$ and to change (within limits) the $N_1$ trap volume. Thus there is considerable flexibility in design and the possibility to optimise the design for a particular application. For example, referring back to FIG. 3, for the parameters shown it is possible to change the point where the curve marked 1 hs crosses the horizontal axis by changing the volume of the trap. It is also possible to multiply the curve marked rhs by a constant (larger or smaller than unity) by changing $\Delta_2$ or $R_{NN2}$. In particular, multiplying it by a factor just slightly larger than 2 would produce an intersection at $T_e/T_0 \approx 1$ with the result that the emitter temperature would be close to the bath temperature at this operating point; however the rate of change of emitter temperature with input power is reduced. On the other hand, if the magnitude of the rhs is decreased, the temperature change due to a change in base current is increased but the behaviour of the device becomes more dependent upon the $P_{ep}$ term. As is discussed below similar considerations apply to the time response and bandwidth of the device.

Figure 11:
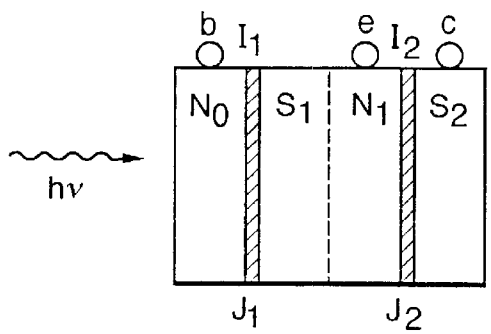
FIG. 11(a) and (c) to (f) illustrate embodiments of the invention in which the base regions of the devices are varied for different applications, with FIG. 11(b) showing a prior art device for comparison.
Figure 11:
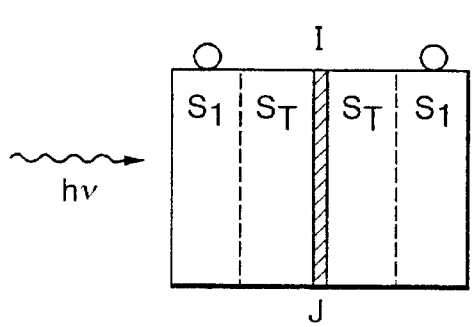
Figure 11:
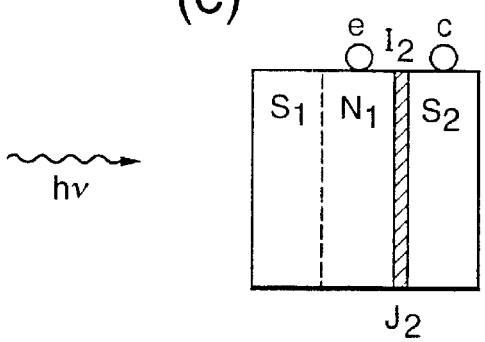
Figure 11:
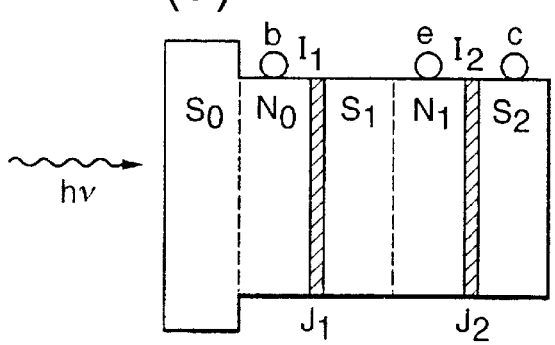
Figure 11:
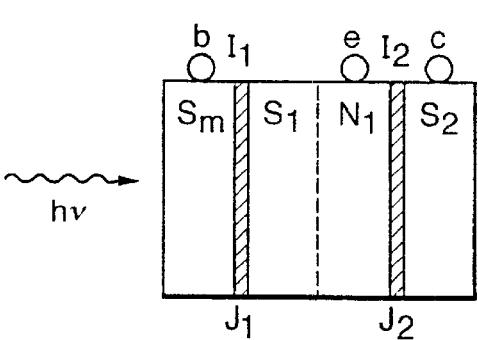
Figure 11:
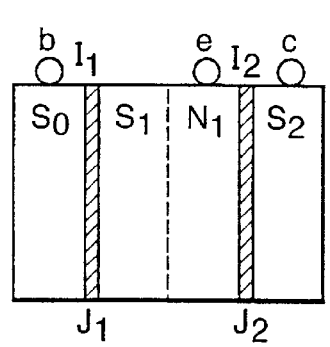
Figure 12:
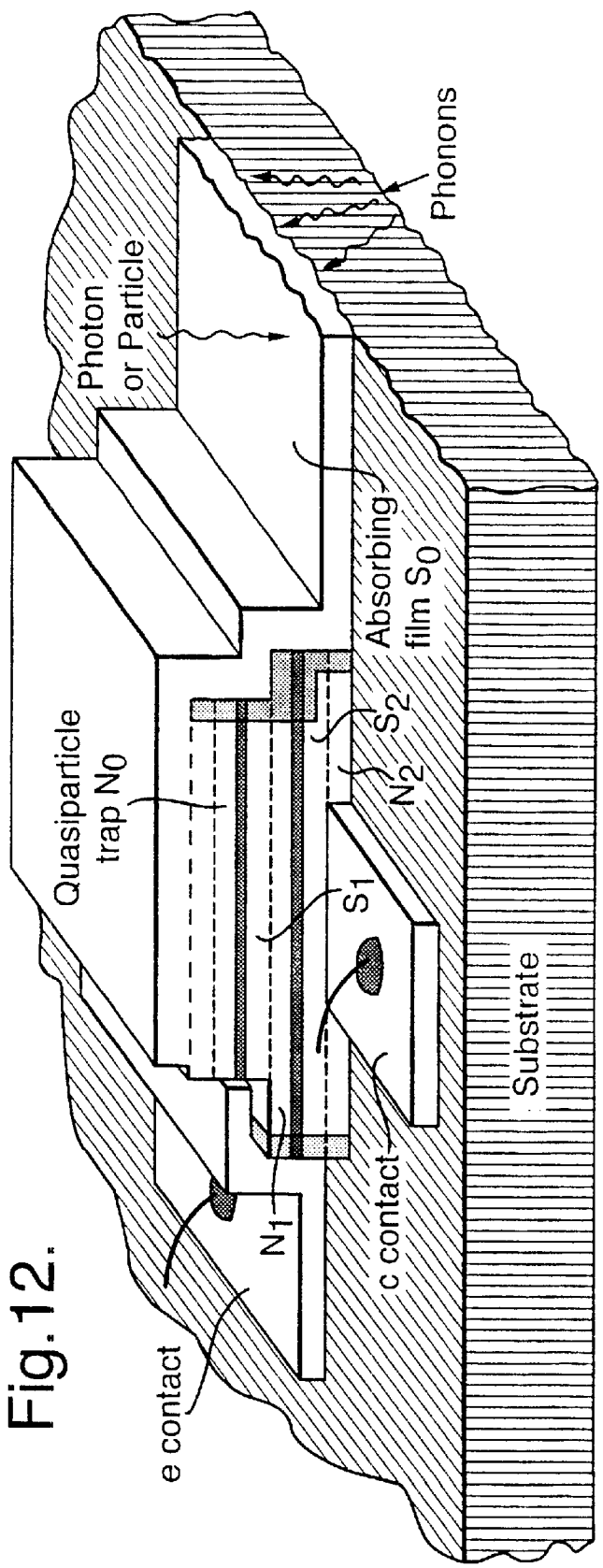
FIG. 12 schematically illustrates the construction of a particle/radiation detector using an embodiment of the invention.

Moreover, as can be seen from eq. (6), the exact nature of the base electrode is not relevant so long as it can inject quasiparticles into $S_1$. In the FIG. 1 embodiment it is a normal metal but it can be a superconductor $S_0$ as shown, for example, in FIG. 11(f). In this case junction $J_1$ can act as a Josephson junction, or the Josephson current can be suppressed by the application of a small magnetic field in the plane of the junction. Also the base electrode could be a thin film of semiconductor $S_m$, for example a photo-sensitive semiconducting material as shown in FIG. 11(e). These devices are described later with reference to the specific applications in which they are useful.

The input characteristic of the device with a normal base electrode is given by eq. (1) (or more accurately by eq. (A1)). For small-signal analysis we need the partial derivative with respect to bias voltage at constant temperature, the normalised input conductance $$g_{Nin} \equiv (\partial I_b / \partial V_{be})_T = R_{NN1} (\partial I_b / \partial V_{be})_T = R_{NN1}/r_{in} \quad (8),$$

where we also define the usual dynamic input resistance $r_{in}$. Here, we mainly use approximate results based on eq. (1) with $V_{ce} > 0$, and its derivatives as these are not only easier to compute but give algebraic results which are relatively transparent.

We now consider a time-dependent change $\Delta T_e(t)$ in the emitter temperature $T_e$ due to a power $P_{sig}(t)$ flowing into the emitter. Eq. (6) may be rewritten in the more general form $$C_e \frac{d[T_e + \Delta T_e(t)]}{dt} = \quad (9)$$
$$P_{sig}(t) + P_e - \Sigma A d [T_e + \Delta T_e(t)]^5 + \Sigma A d T_0^5 - P_{NI}(T_e + \Delta T_e(t))$$

where $C_e$ is the electronic heat capacity of the emitter. For large temperature changes this equation is solved numerically, most conveniently either for constant-current or constant-voltage bias of the collector-emitter junction. For small temperature changes, in the limit $\Delta T_e(t) \ll T_e$, eq. (6) is subtracted from eq. (9) and obtains $$C_e \frac{d[\Delta T_e(t)]}{dt} = P_{sig}(t) - 5\Sigma A d T_e^4 \Delta T_e(t) - \frac{dP_{NI}}{dT_e} \Delta T_e(t) \quad (10)$$

In order to proceed further analytically a form for the time dependence $P_{sig}(t)$ is chosen, in particular, $P_{sig}(t) = \delta P e^{i\omega t}$. It is assumed that this produces a bolometric response $\Delta T_e(t) = \delta T_e e^{i\omega t}$. This gives $$\delta P = (5\Sigma A d T_e^4 + dP_{N1}/dT_e + i\omega C_e) \delta T_e \quad (11)$$

The derivative $dP_{N1}/dT_e$ at either constant voltage bias (CVB) or constant current bias (CCB) is taken. With the approximate form for $P_{N1}$ given in eq. (4) the bolometric sensitivities are obtained:

(a) for CCB $$S_V \equiv \left(\frac{\partial V_{ce}}{\partial P}\right)_I = \left(\frac{\partial V_{ce}}{\partial T_e}\right)_I \left(\frac{\delta T_e}{\delta P}\right)_I = \frac{(\partial V_{ce}/\partial T_e)_I}{(G_{ep} + G_{CCB})(1 + i\omega\tau_{CCB})} \quad (12a)$$

(b) for CVB $$S_I \equiv \left(\frac{\partial I_c}{\partial P}\right)_V = \left(\frac{\partial I_c}{\partial T_e}\right)_V \left(\frac{\delta T_e}{\delta P}\right)_V = \frac{(\partial I_c/\partial T_e)_V}{(G_{ep} + G_{CVB})(1 + i\omega\tau_{CVB})} \quad (12b)$$

where $$G_{ep} = 5\Sigma A d T_e^4$$

$$G_{CCB} = -I_c(\partial V_{ce}/\partial T_e)_I \approx (1/2+\phi)k_B I_c/e$$

$$G_{CVB=(+e,ovs\ \epsilon 2} + ee\ /e - V_{ce})(\partial I_c/\partial T_e)_V \approx \phi(1/2+\phi)k_B I_c/e \quad (12c)$$

where the approximations come from differentiating eq. (1) for $V_{ce} > 0$ and replacing $\overline{\epsilon_2}$ by $\Delta_2$, and where $\phi = (\Delta_2 - eV_{ce})/(k_B T_e)$. The time constants are $$\tau_{CCB}^{-1} = (G_{ep} + G_{CCB})/C_e$$

$$\tau_{CVB}^{-1} = (G_{ep} + G_{CVB})/C_e \quad (12d).$$

Since how $P_{sig}(t)$ is produced in not yet specified, these relations hold for any NIS junction. For future reference, $G_{CCB}$ and $G_{CVB}$ provide electrothermal feedback; both provide negative feedback tending to produce stable operation for both CCB (since $\delta V_{ce}/\delta T_e)_I$ is negative) and for CVB, in contrast to the situation for other bolometric devices which have stability for only one mode of operation.

To obtain the electrical small signal parameters, it is now assumed that $P_{sig}(t)$ is produced by a time-dependent base current $\delta I_b e^{i\omega t}$ which from eq. (3) gives $$P_{sig}(t) = \delta P e^{i\omega t} = \eta(\overline{\epsilon_1}/e)\delta I_b e^{i\omega t} \quad (13).$$

For CCB a small-signal forward-transfer impedance is derived $$z_{tr} \equiv -\left(\frac{\partial V_{ce}}{\partial I_b}\right)_I = -\frac{\eta(\overline{\epsilon_1}/e)(\partial V_{ce}/\partial T_e)_I}{(G_{ep} + G_{CCB})(1 + i\omega\tau_{CCB})} = \frac{r_{tr}}{(1 + i\omega\tau_{CCB})} \quad (14)$$

with transresistance $r_{tr}$ from which is defined, in analogy to the triode, a voltage amplification factor $$\mu \equiv -(\partial V_{ce}/\partial V_b)_T = z_{tr}/r_{in} = \mu_0/(1 + i\omega\tau_{CCB}) \quad (15).$$

Note that the temperature held constant here is that of the base and not the emitter $T_e$. For CVB we derive directly the small-signal current gain $$\beta \equiv \left(\frac{\partial I_c}{\partial I_b}\right)_V = -\frac{\eta(\overline{\varepsilon_1}/e)(\partial I_e/\partial T_e)_V}{(G_{ep} + G_{CVB})(1 + i\omega\tau_{CVB})} = \frac{\beta_0}{(1 + i\omega\tau_{CVB})}. \quad (16)$$

Maximal current gains are achieved at voltage bias values just below $Y_{ce}=1$ where $(\partial I_e/\partial T_e)_V$ is a maximum, and this is a similar behaviour to that of the cooling power.

Although some comparison is drawn between this device and a semiconductor bipolar transistor, the analogy is not very useful because for the transistor, the collector current is almost independent of $V_{ce}$ over a wide range whereas it has a strong dependence for this device, more in common with the vacuum-tube triode. As a result, the mutual conductance is not a useful parameter.

A useful parameter which allows the use of low-frequency voltage-source and current-source equivalent circuits is the output or collector conductance $g_c$ which is given by $$g_c \equiv \left(\frac{\partial I_c}{\partial V_{ce}}\right)_{I_b} = \beta_0/r_{tr}. \quad (17)$$

Figure 6:
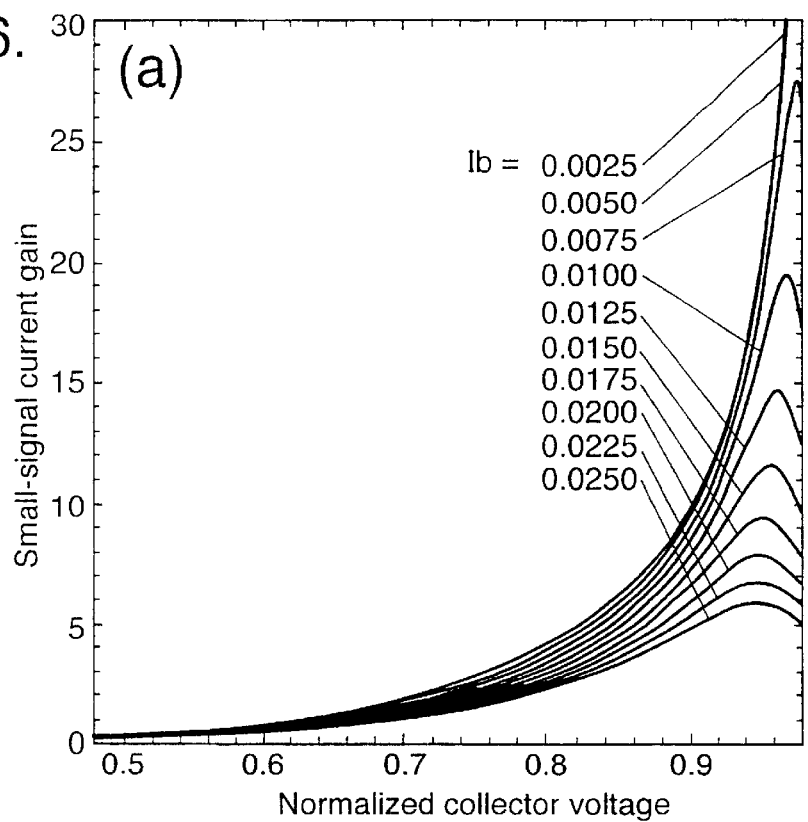
FIG. 6 are graphs showing the small-signal parameters of the device of FIG. 1, FIG. 6(a) showing the current gain $\beta_0$ and FIG. 6(b) showing the normalised output conductance $g_{Nc}$.
Figure 6:
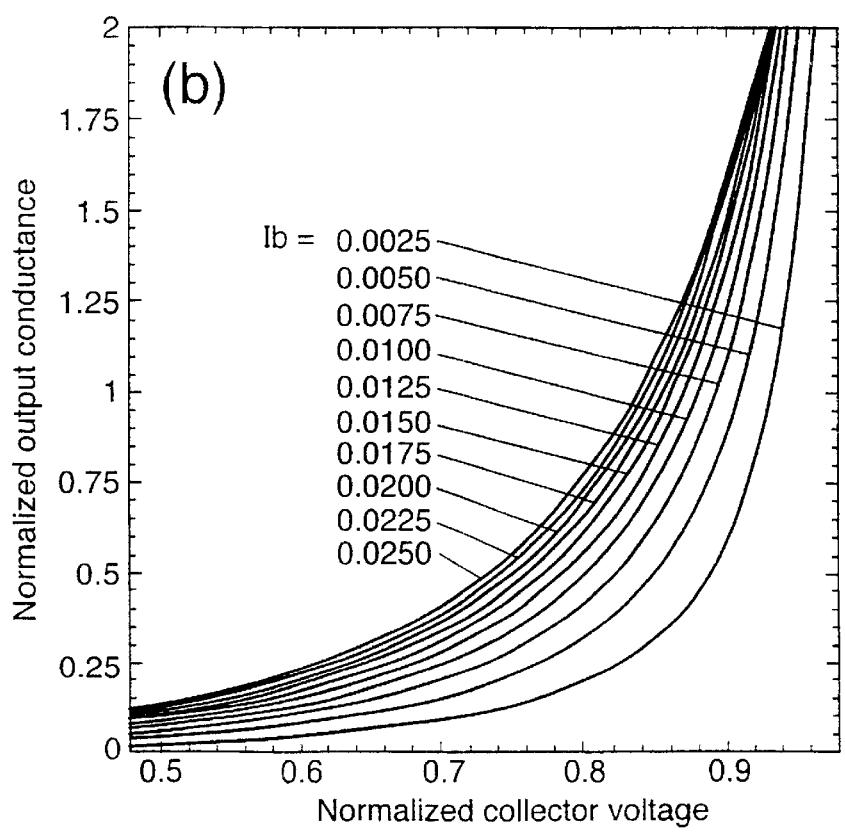

In normalised form $g_{Nc} \equiv R_{NN2}g_c$ is the slope of the collector characteristics shown in FIG. 5. Plots of $\beta_0$ and the output conductance $g_{Nc}$ are shown in FIG. 6, again for the example of Al at 100 mK. The results confirm the estimate of current gains of 10–20.

Figure 20:
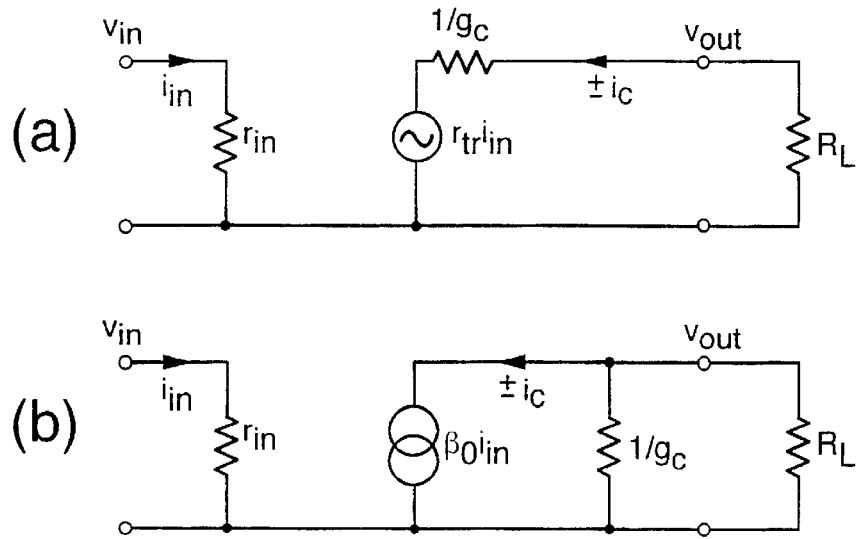
FIG. 20(a) and (b) illustrate equivalent circuits.

The low frequency gains of amplifier stages can now be estimated from the voltage-source or current-source equivalent circuits which follow from eqs. (14)–(17) and which are shown in FIG. 20. For example, for a load $R_L$ FIG. 20(b) gives $$v_{out}/i_{in} = -\frac{\beta_0 R_L}{1 + g_c R_L}. \quad (18)$$

As an example, a value of $g_c$ of 0.1 $\Omega^{-1}$ and $R_L=50$ $\Omega$ can give a circuit transresistance approaching 200 V A$^{-1}$ for a single stage. Recall that the sign of eq. (18) can be reversed by reversing either the b-e or c-e bias polarity.

For operation at high frequencies, the time constants $\tau_{CCB}$ and $\tau_{CVB}$ may be considered. Their variation with $T_e$ and $Y_{ce}$ is rather complicated because of the different dependencies of the heat capacity of the emitter and the thermal conductances, due both to tunneling and to the electron-phonon coupling, on these variables. As an example $\tau_{CVB}$ is plotted in FIG. 7 for the same parameters of FIG. 6. A further discussion of the time constants will be given below.

The sensitivity (or amplifying ability) and the time constants of the device have been discussed. A third attribute which is particularly important for sensitive particle and radiation detection and the analogue amplification of low-level signals is electronic noise. In any application there are noise sources that are intrinsic to the device and also extrinsic sources from the surroundings and attached components and other devices. The e-c junction $N_1$-$I_2$-$S_2$ is considered since it is the temperature of the electrons $T_e$ in $N_1$ which controls the operation. There are three sources of noise intrinsic to an NIS junction, although two of them are correlated. The first is thermal fluctuation noise or "phonon noise" which is due to fluctuations in the electron-phonon power flow. The contributions referenced to the power at the emitter are written in terms of the power spectral density or noise equivalent power NEP). The equilibrium approximation to the phonon noise term is $$|NEP(\omega)|_{ep}^2 \approx 4k_B T^2 G_{ep} \,[W^2/Hz] \quad (19).$$

The other intrinsic contributions are the electrical and thermal effects of shot noise in the junction. Shot noise in the c-e junction produces a mean-square current fluctuation in a unit bandwidth given by $\overline{\delta i_c^2} \approx 2eI_c$. A shot-noise current can be defined as $I_{SN}=\sqrt{2eI_c}$ which also gives a shot-noise voltage $V_{SN}=\sqrt{2eI_c}/g_c$. These produce fluctuations in the cooling power $P_{N1}$ of eq. (4). The thermal effect of shot noise follows from the same steps leading from eq. (11) to eq. (12) but using $V_{SN}$ at CCB to generate $\delta T_e$, and $1_{SN}$ at CVB. There is partial cancellation when the electrical and thermal effects are added, with the same result for CCB and CVB, namely $$|NEP(\omega)|_{Shot}^2 = 2eI_c/|S_{I,ep}|^2 = (2eI_c/g_c^2)/|S_{V,ep}|^2 \quad (20),$$

where $$S_{I,ep} = \frac{(\partial I_c/\partial T_e)}{G_{ep} + i\omega C_e} \text{ and } S_{V,ep} = \frac{\partial V_{ce}/\partial T_e)}{(G_{ep} + i\omega C_e)}. \quad (21)$$

The b-e junction is now considered. Again there is shot noise $\overline{\delta i_b^2} \approx 2eI_b$, and each quasiparticle carries an energy $\Delta_1$ into the emitter with efficiency $\eta$. The noise power, referenced to the power at the emitter, is $$|NEP(\omega)|_b^2 = 2\eta^2 \Delta_1^2 I_b/e \quad (22).$$

In this expression $I_b$ may be the b-e junction bias current or the signal current. The total intrinsic $|NEP(\omega)|^2$ is then given by the sum of eqs. (19), (20), and (22).

For connection to another device, such as a nearby 2-stage SQUID amplifier or a room-temperature amplifier with input current noise $\overline{\delta I_{Amp}^2}$ and voltage noise $\overline{\delta V_{Amp}^2}$, there is the additional contribution $$|NEP(\omega)|_{Amp}^2 = \overline{\delta I_{Amp}^2}/|S_1|^2 + \overline{\delta V_{Amp}^2}/|S_V|^2 \quad (23),$$

where $S_1$ and $S_V$ are defined in eq. (12).

The NEP is important for detector applications in a bolometric mode, and also when the energies of individual particles or photons are measured since the NEP can be related to the energy resolution. However, for electronic devices it is more useful to know the current and voltage equivalent noise sources at the input. For this device the physics leading to eq. (3) provides a relationship between power at the emitter and current input at the base, and the current noise at the input is:

$$\overline{\delta I_{in}^2} = \frac{1}{\eta^2(\Delta_1/e)^2}\sum|NEP(\omega)|^2 \quad (24)$$

$$2eI_b + \frac{2eI_c}{|\beta|^2}\frac{G_{ep}^2}{(G_{ep}+G_{CVB})^2}\frac{(1+\omega^2\tau_{ep}^2)}{1+\omega^2\tau_{CVB}^2} +$$

$$\frac{4k_B T_e^2 G_{ep}}{\eta^2(\Delta_1/e)^2} + \frac{\overline{\delta I_{AMP}^2}}{|\beta|^2} + \frac{\overline{\delta V_{Amp}^2}}{|z_{tr}|^2}\,[A^2/Hz],$$

where $\tau_{ep}=C_e/G_{ep}$. There will also be Johnson noise in any base bias resistor $R_b$ which gives a contribution $\overline{\delta i_j^2}=4k_B T/R_b$.

Physical Structure

Figure 4:
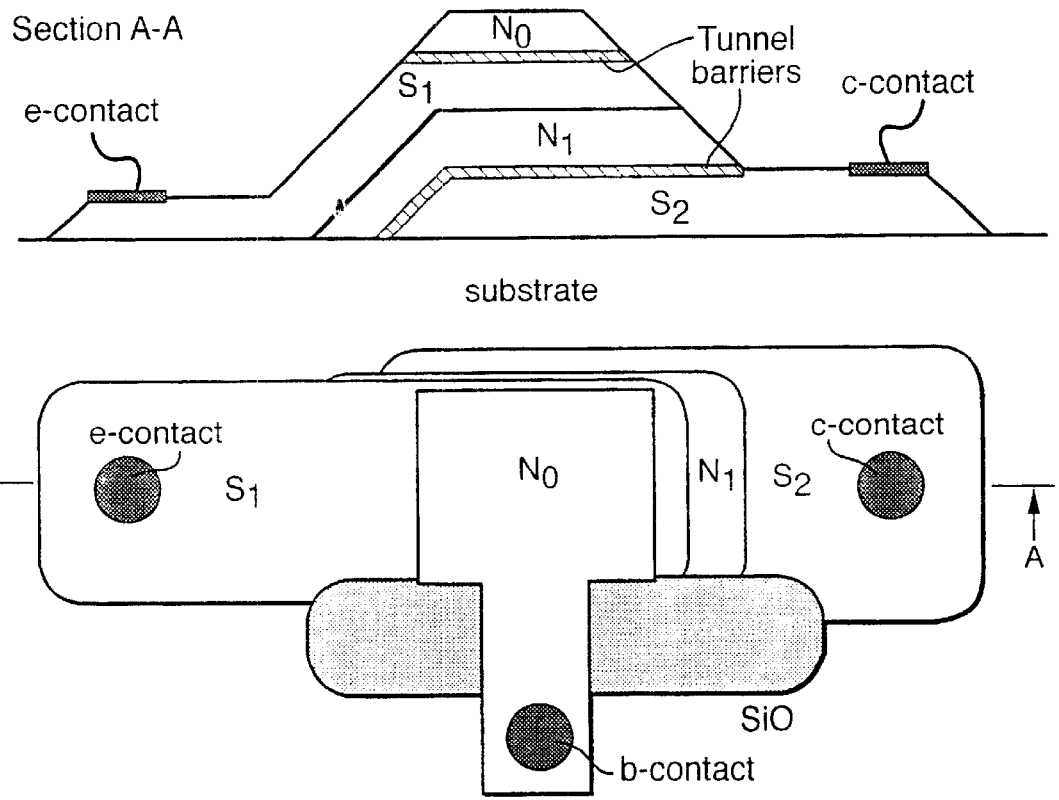
FIG. 4 is a schematic fabrication diagram for the device of FIG. 1.

Devices embodying the invention can be fabricated with thin-film technology using either shadow masks or photo-lithographic masks. This technology is the same as that used for the fabrication of other superconductive devices such as SQUIDs. A very simple N-I-SN-I-S device as discussed above fabricated using shadow masks is shown schematically in FIG. 4 in which the vertical scale is grossly exaggerated and with the layers labelled as before. Contact to the base electrode $N_0$ is made at right angles to the plane of the figure using a film of silicon oxide to isolate the contacting film from the other electrodes. For micron-scale lithography, devices can be fabricated using modifications of the planar-stacked junction technique developed for the Quiteron. The edge-stacked technique is not suitable because of the bilayer structure of the central electrode. A technique based on slight modifications of a whole-wafer processing route developed for three-terminal devices is also feasible. A stacked junction geometry is desirable as this minimises the distance which quasiparticles have to travel before being trapped in normal metal films. However, a geometry in which the junctions are side by side on the substrate has the possible advantage of better cooling which may be useful in some applications.

An important fabrication requirement is high-quality, clean interfaces between the superconductive films and their corresponding normal metal traps. This requirement applies to all devices which use quasiparticle trapping. It is important for the operation of the devices of the invention that both the superconductive and normal components of the emitter electrode are sufficiently thick such that the proximity effect does not dominate. Both components should have thicknesses greater than the Pippard coherence length in the superconductive component which, depending upon the purity, is shorter than the intrinsic coherence length. Intrinsic coherence lengths are known for some superconductors, for instance for high-purity aluminium it is about 1.6 micrometers, for niobium about 0.04 micrometers, and very much shorter for higher temperature superconductive materials. The effective coherence length can be shortened by purposely using impure or disordered superconductive materials.

With further regard to the materials, both normal metals and superconductors, there is a wide choice. For detector applications, where it is important to operate at temperatures well below 1 K, aluminium is a good choice as the superconductor. For more general applications where a higher operating temperature can be used, niobium and niobium nitride are good choices. For the normal-metal films, molybdenum or tungsten are good choices to go with niobium or niobium nitride as the electron-electron interaction is expected to dominate over the electron-phonon interaction over a wide range of operating temperatures. There are also good metallurgical reasons. These normal metals could also be used with superconductive aluminium. Some other possibilities for use with aluminium are magnesium, calcium, copper, palladium, silver and gold. One possible advantage of using magnesium as a normal-metal film is that it is readily oxidised to form a tunnel barrier. This gives added flexibility to device design where otherwise tunnel barriers must be fabricated only on the superconductive films. As mentioned above, for coherence length reasons it may be advantageous to use impure superconductive materials. Also, for the normal metals it may be advantageous to use impure or disordered materials, as this tends to increase the strength of the electron-electron interaction relative to that of the electron-phonon interaction.

Of course the devices can use high-temperature superconductors or organic superconductors. Apart from the capability of operating at higher temperatures, high-temperature superconductors have a larger energy gap than conventional low-temperature superconductors. This permits output voltage swings of perhaps a few hundred millivolts, instead of the few millivolts possible with conventional superconductors.

As mentioned above it is possible to use a thin semiconducting film $S_m$ instead of the normal metal film $N_0$ (or a superconductive film $S_0$) as the base electrode. During operation the conductivity of the semiconducting film $S_m$ should be sufficiently high that most of the bias voltage $V_{be}$ appears across the tunnel barrier $I_1$ and not across the semiconducting film $S_m$. This device is useful in radiation detection using photoconductivity or hot-electron effects. There are many possibilities for the semiconductor in this context for example InSb.

Figure 16:
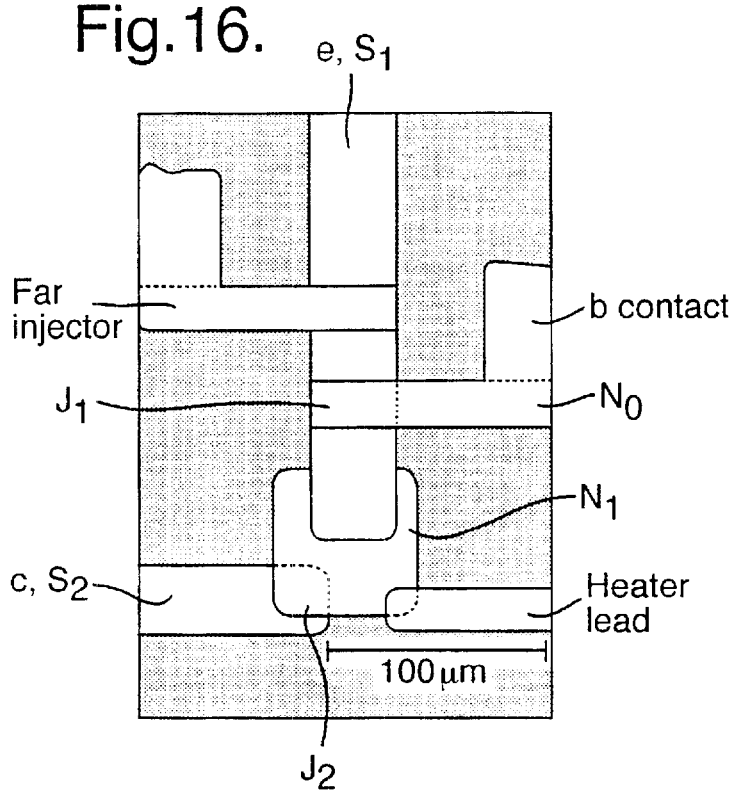
FIG. 16 is a photograph of a test device according to an embodiment of the invention.

A test device which demonstrates the principles of operation is shown in FIG. 16. The central strip labelled "e, $S_1$" is an Al film. The Ag-I-Al junction marked "Far injector" was used to evaluate quasiparticle losses and is not part of the main device structure. Also, the superconducting heater electrode is not part of the main device structure but is used to compare the effect of heating of the electron system of the Ag trap (labelled $N_1$) by quasiparticle trapping with that of Joule heating of the trap by injecting a current via the heater electrode. The current through the collector junction $J_2$ or the voltage across it was calibrated as a thermometer by varying the bath temperature in a known way. Once this is done, this junction together with the heater electrode can be used to measure the electron temperature of the Ag, and to demonstrate the validity of eg. (6) and measure the important quantity $\Sigma$. Quasiparticles can be injected into the superconducting Al strip via the base-emitter junction $J_1$ (or the "Far injector") and the energy deposited in the Al trap can be measured and compared with energy deposited by Joule heating using the heater electrode. In these devices it was found that trapped quasiparticles transfer more than 80% of their excitation energy to conduction electrons in the Ag trap over a broad range of electron and phonon temperatures. A slightly higher limit of 90% energy transfer efficiency has been found for quasiparticles diffusing from Al into W at its transition temperature of about 100 mK.

Figure 17:
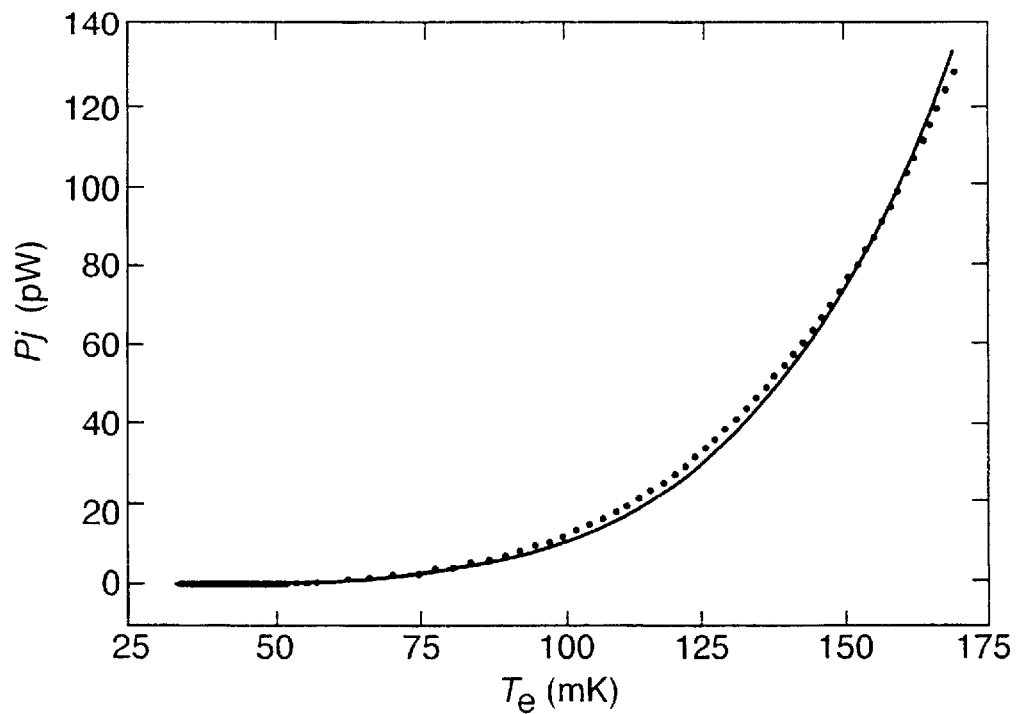
FIG. 17 illustrates the relationship between Joule power and electron temperature in the device of FIG. 16.
Figure 18:
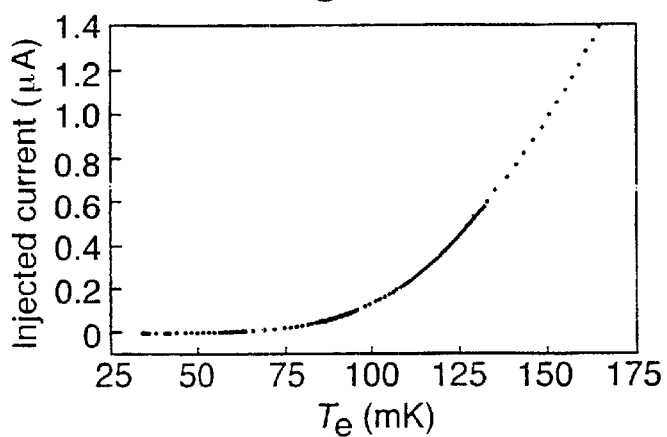
FIG. 18 illustrates the relationship between electron temperature and injected quasiparticle current in the device of FIG. 16.

FIG. 17 shows the Joule power $P_J$ produced by the heater electrode needed to elevate the electron temperature in the trap. The smooth curve is a fit to the form $P_J=\Sigma Ad(T_e^5-T_0^5)$ and yields the value $\Sigma=2.\text{lnWK}^{-5} \mu m^{-3}$. FIG. 18 shows the relationship between electronic temperature in the trap and the quasiparticle current injected at the base-emitter junction $J_1$. This clearly demonstrates that the injected quasiparticles heat the electrons in the trap and that the heating power is proportional to injected current as predicted by eq. (3). A detailed fit to the temperature dependence would have to include how the mean quasiparticle energy $\overline{\epsilon_1}$ depends upon injector current and also the dependencies of the quasiparticle diffusion coefficient and the quasiparticle self-recombination rate. However, neglecting these details and making a rough fit a combined efficiency of 1/3 is obtained for the trapping of quasiparticles and the transfer of their energy to conduction electrons in the trap. This numerical value is consistent with expected quasiparticle loss during diffusion from $J_1$ to the trap, and the fit demonstrates that eq. (6) predicts approximately the behaviour of this device.

Figure 19:
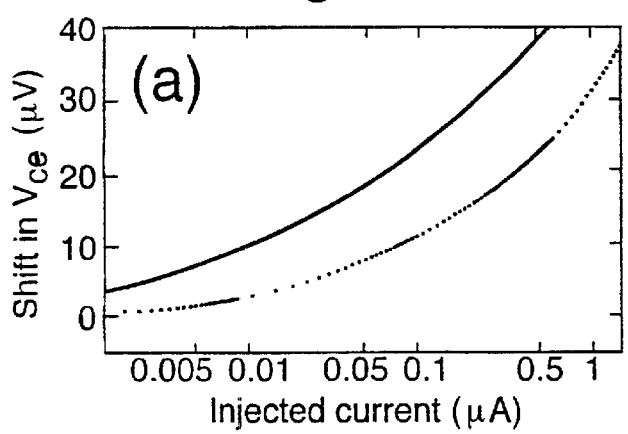
FIG. 19(a) illustrates the relationship between the injected current and shift of $V_{CE}$ in the device of FIG. 16.
FIG. 19(b) illustrates the relationship between the transresistance as a function of injected current for the device of FIG. 16.
Figure 19:
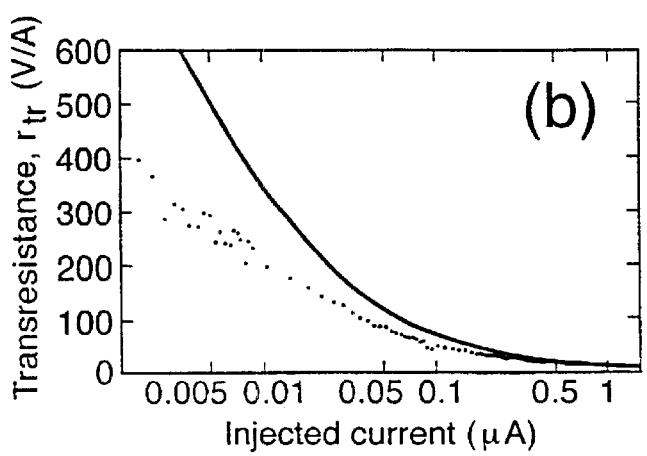

Several sets of $I_c/V_{ce}$ points were measured at a number of trap temperatures and the results were qualitatively the same as in FIG. 5. Then a scan was made at a constant collector current of 0.045 $\mu A$ and the shift in $V_{ce}$ was measured as a function of current injected at $J_1$. The result is shown in FIG. 19(a). The smooth curve comes from eq. (1) using measured values of $\Delta_2$ and $R_{NN2}$. The agreement is only qualitative but there is one uncertainty in the absolute temperature scale and also the accuracy of eg.(1) is changing in the region shown. FIG. 19(b) shows the experimental transresistance evaluated from numerical differentiation of the $V_{ce}$ data. The smooth curve is the prediction from the approximate form of eq. (14) using the experimental value $\eta \approx 1/3$. Finally, the $I_c/V_{ce}$ curve measured without injection gives a value of $g_c \approx 0.02$ AV$^{-1}$. Using this together with the maximum observed $r_{tr} \approx 4.00$ VA$^{-1}$ and eq.(17) we obtain $\beta_0 \approx 8$. With a geometry designed to minimise quasiparticles losses, values of 20 should be obtainable.

Electrical Characteristics

The use of devices with normal metal base electrodes as electronic circuit devices willnow be described.

The input characteristics of the device with a normal metal base electrode are given essentially by eq. (1) and its partial derivative with respect to bias voltage at constant temperature, the normalised input conductance $g_{Nin}$. The reverse transfer characteristics depend mainly upon phonon transfer from $S_2$, $N_1$ and $S_1$ back to $N_0$. How big these effects are depends very strongly on the geometrical arrangement. When the base electrode is used as a phonon or radiation detector the partial derivatives of input current and of voltage with respect to temperature, $(\partial I/\partial Z)_Y$ and $(\partial Y/\partial Z)_I$ are of interest.

In order to obtain the forward transfer and output characteristics the power-balancing eq. (6) must be solved. Because of the wide range of possibilities for operating temperature $T_0$, superconductors with different values of $\Delta$, and different design values of $R_{NN}$, $\Omega_{NN}$ and $\Sigma$, it is useful to rewrite eq. (6) in terms of normalised powers $P_i$ expressed in units of $(\Delta_1/e)^2/R_{NN1}$:

$$\eta I_b - \left[ \frac{\sum \Omega_e R_{NN1}}{(\Delta_1/e)^2} \left(\frac{\Delta_1}{k_B}\right)^5 \right] Z_0^5 [t_e^5 - 1] \approx I_c(1 - Y_{ce})C_{21} \quad (25a)$$

where $$t_e = T_e/T_0 = Z_e/Z_0 \text{ and } C_{21} = \left(\frac{\Delta_2}{\Delta_1}\right)^2 \left(\frac{R_{NN1}}{R_{NN2}}\right) \quad (25b)$$

Most of the calculations take $\eta = 1$ and $C_{21} = 1$.

Examples of the collector characteristics are shown in FIG. 5 for $\Delta_1$, $\Delta_2$ and $Z_0$ corresponding to aluminium at 100 mK. The curves are for different values of the normalised base current in steps of 0.0025 from 0.0025 to 0.025. As shown, linear load lines can be chosen to give both current gain and voltage gain. The sample load lines are: (a) a load resistor $R_{NN}/10$ and supply voltage of 0.9 $\Delta/e$, (b) load resistor 20 $R_{NN}$ and supply voltage of 1.5 $\Delta/e$, (c) another device according to the invention as the load (in this case with a $\Delta$ twice that of $\Delta_2$ and a supply voltage of 2.7 $\Delta/e$). Although regions of linear operation are limited for resistor load lines, it is clear that using another of the devices as the load (perhaps in a cascode configuration) can extend the region of linearity.

The devices of the invention can be compared with the well-known semiconductor bipolar transistor. The analogy is not too useful because for the transistor the collector current is almost independent of $V_{ce}$ over a wide range, whereas it has a strong dependence in the devices of the invention, more in common with the vacuum-tube triode. As a result, the mutual conductance is not a very useful parameter. For the most part the input and output conductances and the small-signal current gain $\beta$ are used.

Taking the collector current as a function of base current and collector voltage (constant voltage bias), the small-signal current gain is given by $$\beta = \frac{\beta_0}{(1 + j\omega\tau_{VB})} \quad (26)$$

where the time constant $\tau_{VB}$ will be evaluated later. Plots of the current gain $\beta_0$ and the normalised output conductance $g_{Nc}$ are shown in FIG. 6, again for the example of aluminium at 100 mK. The parameters are plotted against normalised collector voltage for various values of normalised base current in steps of 0.0025 from 0.0025 to 0.025. This confirms the previous estimate that current gains of 10–20 are achievable. Maximal current gains are achieved at voltage bias values just below $Y_{ce} = 1$, which is a similar behaviour to that of the cooling power. Values of $g_{Nc}$ are typically in the range of 0.1 to 2. This gives output resistances in the range from 0.5 to 10 times $R_{NN}$.

The low-frequency gain of amplifier stages can now be estimated from the current-source equivalent circuit formula for a load $R_L$:

$$\frac{v_{out}}{i_{in}} = -\frac{\beta_0 R_L}{1 + g_{Nc} r_L} \quad (27)$$

where $r_{L=RL}/R_{NN2}$. A voltage-source equivalent circuit may be easily derived from the fact that $v_{in}/i_{in} = r_{in} = R_{nn1}/g_{Nb}$.

Figure 7:
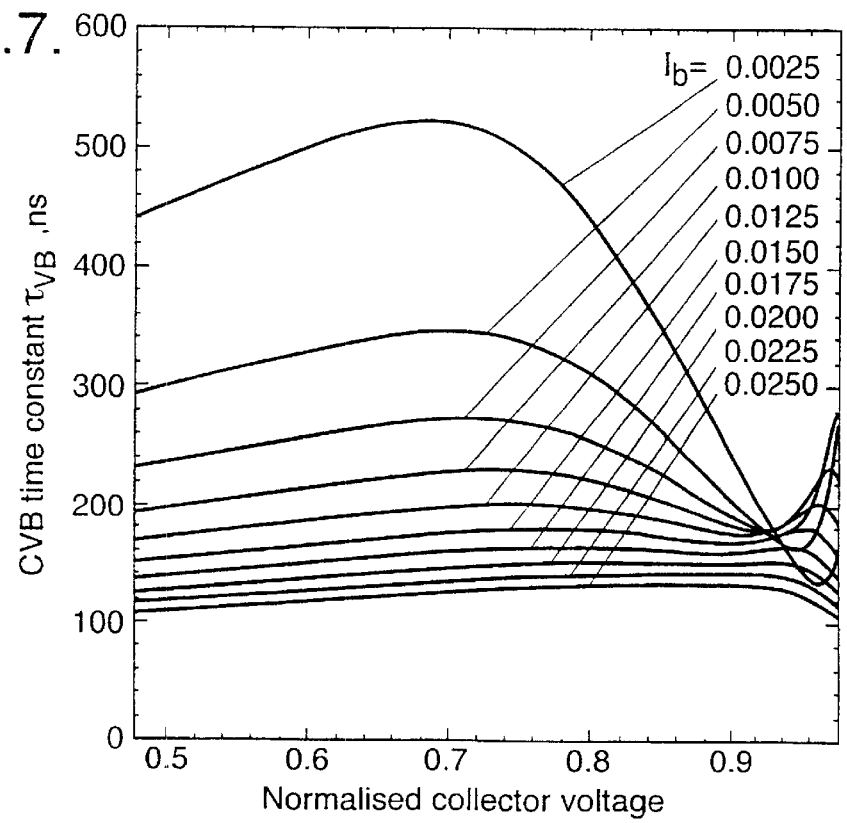
FIG. 7 is a graph illustrating the time constant for thermal recovery of an aluminium device at 0.1K.

For operation at high frequencies the time constant $\tau_{VB}$ must be considered and this is plotted in FIG. 7 for constant voltage bias with superconductive aluminium films and operated at 100 mK. The curves are plotted against normalised collector voltage for various values of normalised base current in steps of 0.0025 from 0.0025 to 0.025. The variation of $\tau_{VB}$ is complicated because the quantities it depends upon, the heat capacity of the emitter and the thermal conductances due to tunneling and due to the electron-phonon coupling, are functions of $T_e$ and $Y_{ce}$. A discussion of other factors which control the value of $\tau_{VB}$ will be given below with reference to the speed of the device when used as a digital switch.

Figure 21:
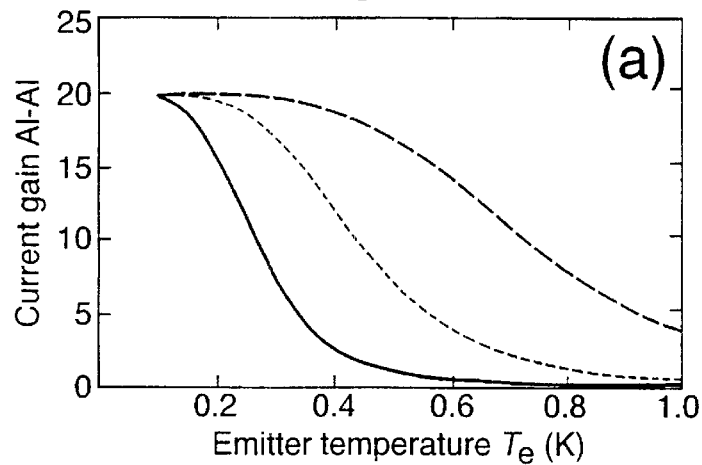
FIGS. 21 and 22 illustrate graphical representations.
Figure 21:
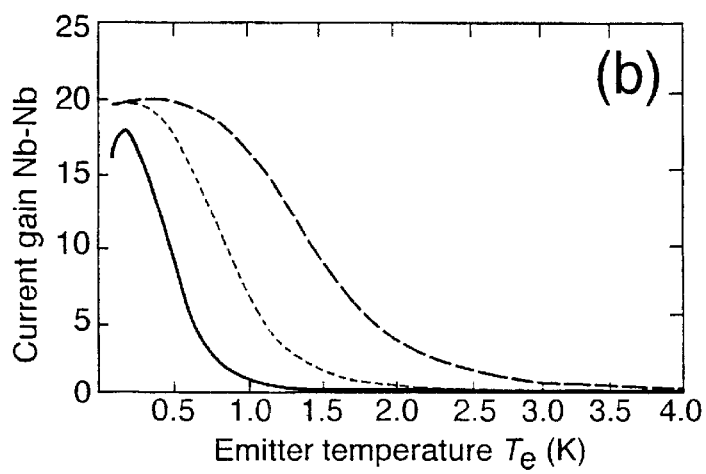

For detector applications, where it is usually important to operate at temperatures well below 1 K, Al is an acceptable choice as the superconductor, although it is not particularly robust. At temperatures above about 0.2 K the current gain starts to decrease mainly because of the strong temperature dependence of $G_{ep}$. This is illustrated in FIG. 21(a) where $\beta_0$ is plotted for $Y_{ce} = 0.95$ as a function of emitter temperature (solid curve). It is possible to extend the upper temperature range by decreasing $R_{NN2}$. The dashed curve shows the effect of a factor of 100 decrease to $R_{NN2} = 0.01 \, \Omega$. However this value is probably at the limit of technical capability. The dotted curve shows the effect of at the same time increasing the trap volume by a factor of 10 with the same value of $R_{NN2}$. This indicates that it should be possible to operate devices based on Al about 0.35 K corresponding to a $^3$He refrigeration system, but not higher.

For more general applications and where a higher operating temperature can be used, Nb and NbN are good choices. These materials also permit a much larger voltage output swing because of the much larger values of $\Delta$. FIG. 21(b) shows the corresponding curves for Nb. The results for NbN are similar but are shifted to higher temperatures by about 0.3 K. This means that it is just feasible to operate devices based on Nb or NbN effectively at about the 1.2 K temperature of pumped $^3$He but not much higher. Suitable temperatures are readily obtainable with $^3$He systems, dilution refrigerators and adiabatic demagnetisation systems.

Figure 22:
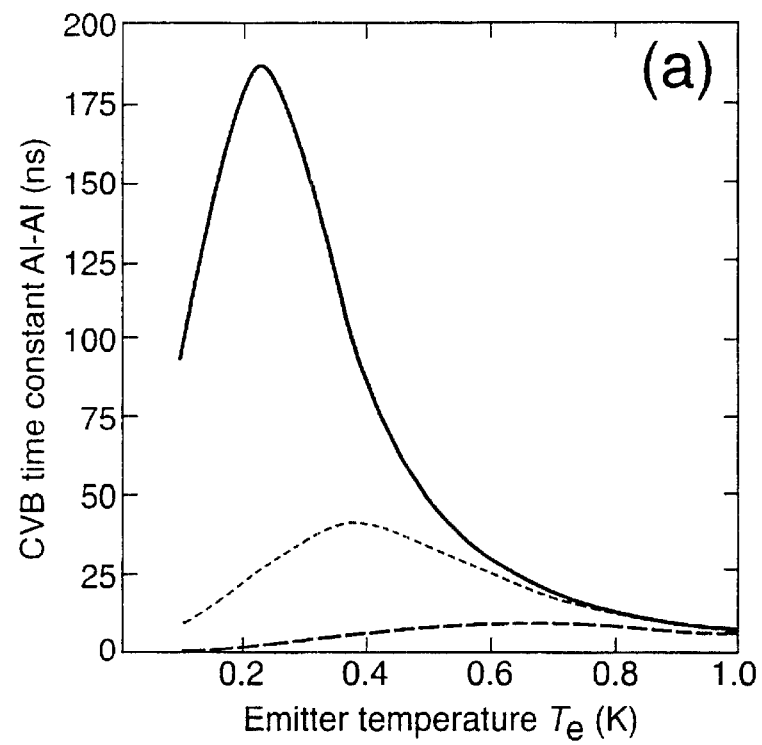
Figure 22:
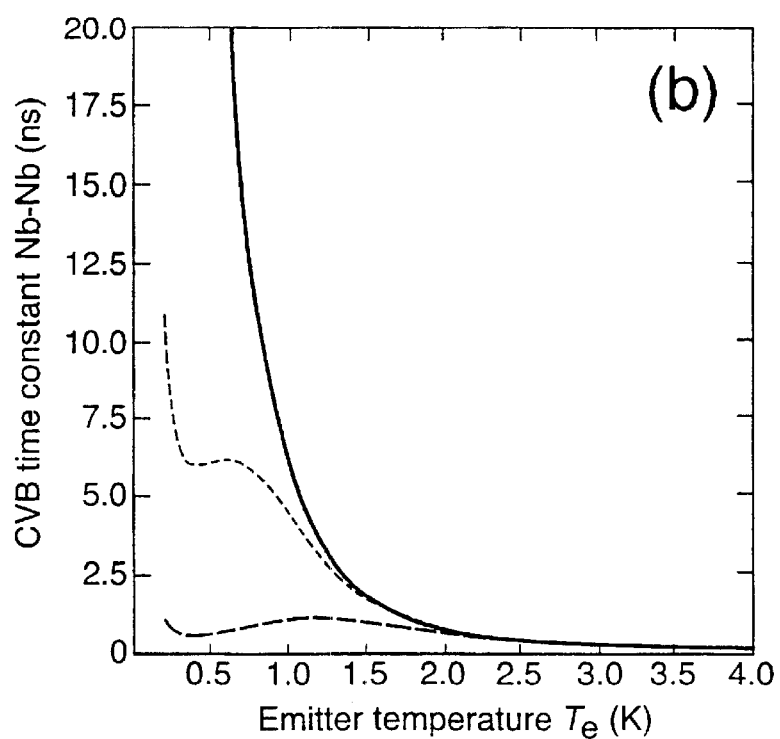

The time constant $\tau_{CVB}$ plotted in FIG. 7, which was computed for a normal metal trap volume of 40 $\mu$m$^3$ and operation at a temperature of 0.1 K, gives only a rough guide to the expected time response. It is a measure of the time for thermal recovery after an excitation, and can be changed by several orders of magnitude by changing the operating temperature and the fabrication parameters of the device. Also, it is apparent from the structure of eqs. (12d) and (16) that current gain can be traded off for recovery time and vice versa. FIG. 22(a) shows how $\tau_{CVB}$ for Al varies with emitter temperature and other parameters as discussed with reference to FIG. 21(a). FIG. 22(b) shows the corresponding results for Nb. The results for NbN are very similar. Recovery times of a few nanoseconds are possible for devices with a stacked junction geometry. For the side-by-side geometry there is an additional contribution to the time response to the spread in diffusion times of the quasiparticles to the trap.

An important fabrication requirement is high-quality interfaces between the S films and their corresponding N-metal traps, particularly for the $S_1N_1$ interface. This requirement applies to all devices which use quasiparticle trapping. It is also important for the operation of the device that both the $S_1$ and $N_1$ components of the emitter electrode are thick enough so that $S_1$ remains superconducting without an appreciable change in its energy gap due to its proximity to $N_1$, and $N_1$ stays normal with no induced energy gap. If they are too thin, the energy gap of $S_1$ is reduced and $N_1$ becomes superconducting due to the proximity effect. A suppression of the density of states at all Fermi level in $N_1$ is probably acceptable, but if there is a small energy gap there will be a Josephson current which will lead to biasing instabilities unless suppressed by a magnetic field. From the discussion above, the operation of the device is improved for high tunnel conductance (in practice larger junction area) and small trap volume (in practice a thinner $N_1$ film).

At the time when quasiparticle trapping was first being investigated and applied to tunnel junction devices, the only available model of the proximity effect was restricted to very thin layers. A more general theory of superconducting bilayers for quasiparticle trapping, but still with restrictions, was developed by Golubov and collaborators. More recently the theory has been extended to mesoscopic length scales, but only in the limiting case of perfect transparency of the $S_1$-$N_1$ interface, and including magnetic effects and to a generalised model of bilayers for tunnel junction detectors. For the thin films used in practice operation is usually in the "dirty limit" where the electron mean free path is shorter than the superconducting coherence length in $S_1$ and the correlation length in $N_1$. For this device, the following can be summarised:

(1) The thickness $d_S$ and $d_N$ scale with the superconducting coherence length in $S_1$. Thus $S_1$ should have a short coherence length, so Nb and NbN or Ta should be chosen rather than Al in order to have thin layers. The length scales could also be shortened by purposely making the films dirty, but this is not advisable as good quasiparticle transmission through $S_1$ and across the $S_1$-$N_1$ interface is desired.

(2) The thickness of $S_1$ should be at least one coherence length, preferably several. With an intrinsic coherence length of about 38 nm for Nb, this is no problem.

(3) A non-zero energy gap (minigap) always exists in $N_1$ when $d_N$ is finite; the magnitude of the gap falls off as $d_N$ is increased approximately as $1/d_N^2$. The minigap is higher if the interface is more transparent. This is most undesirable.

(4) The introduction of a spin-flip scattering rate $\Gamma_{sf}$ suppresses the minigap and can lead to a gapless situation when $\Gamma_{sf} \geq 0.4\Delta/\hbar$. Spin-flip scattering can be produced by magnetic impurities and this leads to Cooper pair breaking in $N_1$. An applied magnetic field is also a pair breaking mechanism and can be used to remove the minigap in $N_1$.

Copper films were deposited with thicknesses ranging from 250 to 500 nm on high purity single crystals of In, tunnel junctions were fabricated on the Cu and their characteristics were measured at temperatures between 0.35 K and 1 K. For devices with relatively poor interface transmission, the minigap in the Cu decreased smoothly from 24 $\mu$eV for 250 nm of Cu to 10 $\mu$eV for 500 nm. For one device with very high interface transmission the minigap was 180 $\mu$eV for 450 nm of Cu.

For a bilayer consisting of 200 nm Ag and 200 nm Al with a tunnel junction fabricated on the Ag, it has been found that the Ag was normal at temperatures above 0.43 K with the Al superconducting, but the Ag became superconducting with a minigap of 50 $\mu$eV at temperatures below this. Also, at 0.18 K the superconductivity in the Ag could be quenched by an applied magnetic field of 4.5 mT. In a first attempt to fabricate a stacked junction device a Josephson current was observed with a junction fabricated on the Ag side of a Al (380 nm)-Ag (300 nm) bilayer, and this indicates that the Ag was superconducting.

These results together indicate that even for $N_1$ thickness as large as 500 nm, $N_1$ is usually superconducting, at least when $S_1$ is Al or In. For the results with In crystals, the coherence length in $S_1$ was certainly close to the bulk value of 440 nm.

In another experiment, the density of states in a Cu wire in good contact with Al was measured at distances of 200, 300 and 800 nm from the interface. Reductions in the density of states near the Fermi energy were found in the Cu, but there was no minigap. This lack of a minigap was attributed to spin-flip scattering with a fitted value of $\Gamma_{sf}= 1.5 \times 10^{10} s^{-1}$. The geometry used in this experiment resembles the side-by-side geometry of FIG. 16 (except reduced in linear scale by about a factor of 50).

This demonstrates that it is straightforward to avoid having a minigap in $N_1$ if the side-by-side geometry is used. For a stacked geometry it may be necessary to use a small applied magnetic field, or to introduce magnetic impurities into $N_1$. Another possibility is to use a metal with a high magnetic susceptibility at low temperatures, for example Pd. Otherwise, the material for $N_1$ should be chosen for metallurgical reasons. For example, Mo or W are good choices to go with Nb or NbN. Some other possibilities are Mg, Ca, Cu, Pd, Ag and Au. One possible advantage of using Mg is that it is readily oxidised to form a tunnel barrier. This gives added flexibility to device design where otherwise tunnel barriers must be fabricated only on the S films.

Hot-electron effects in metals at low temperatures are well known. When an electrical current I flows in a metal at low temperatures the standard two-temperature model assumes that the $I^2R$ power is deposited in the electron system, and that the energy gained by the electrons from the electric field is transferred via the electron-phonon interaction in the metal to the lattice and substrate system at temperature $T_0$. At low temperatures, the electron-phonon coupling becomes so weak that the energy is distributed by collisions among electrons more rapidly than it can be transferred to the lattice. This leads to a new electron energy distribution characterised by an electron temperature $T_e$ which is higher than the lattice temperature. Energy is transferred between the electron and phonon system according to eq. (5) and the effective thermal conductance between the conduction electrons and the phonon system at low temperatures is proportional to $T^4$.

However, an earlier phase needs to be considered. When the quasiparticles enter the normal film, how and with what efficiency do they share their energy with other electrons and form an energy distribution which can be characterised by a temperature $T_e$? Recall that they enter the trap with energy $\Delta_1$ which corresponds to a temperature $\Delta_1/k_B$ which is about 2.0 K for Al and 17 K for Nb. Excitation energies E are expressed in Kelvin as this is customary in the literature. During thermalization all energies below $\Delta_1/k_B$ relevant. At the other end of the energy scale are the experiments with pulsed laser excitation of metallic films which produce electron energies of 100s of K.

This device makes use of the energy of a quasiparticle trapped in film $N_1$ being distributed among the other electrons of the film in a cascade process. A trapped quasiparticle can transfer its energy to other electrons by electron-electron interactions or by emitting a phonon which is then absorbed by another electron. Quasiparticle energy is lost from the electron system of the trap if relaxation phonons leave film $N_1$ before exciting an electron. Hence, the device uses the relative rates of electron-electron (e-e), electron-phonon (e-p), phonon-electron (pe), and phonon escape (esc) processes. Direct measurements indicate that trapped quasiparticles transfer most of their excitation energy to other electrons. In devices similar to that described above, quasiparticles were trapped from superconducting Al into normal Ag, and the thermalization efficiency was measured to be greater than 80% and independent of temperature at bath temperatures below 380 mK. An evaluation of the scattering rates of the various processes involved supports and explains these results. This analysis is summarised below.

The e-e scattering rate depends strongly on the energy of the scattering electron, the effective dimensionality (D) of the sample, and the degree of disorder present. The crossover from 3D to 2D behaviour in the trap occurs when the excitation energy of the electron is less than the uncertainty in energy associated with the transit time across the trap. In a thin film device such as this device, the trap is likely be 2D. The trap film is considered dirty if $$E < \frac{\hbar}{k_B \tau_{el}} \frac{\pi}{k_F d_N} \tag{28}$$

where $\tau_{el}$ is the elastic scattering time, $k_F$ the Fermi wavenumber, and $d_N$ the trap thickness. Both clean and dirty scattering will occur, with dirty scattering dominating as the thermalization cascade progresses to lower energies. We can summarise the em scattering times as follows:

$$\text{Dirty: } \tau_{ee}^D \approx 10 ns/(R_{sq}E) \tag{29}$$

$$\text{Clean: } \tau_{ee}^C = \frac{2\hbar E_F}{\pi k_B E^2 \ln(E_F/E)} \approx 30 ns/E^2,$$

where $R_{sq}$ is the sheet resistance and where the numerical values apply to Ag films.

Again, E and $E_F$ are in Kelvin.

In comparison, the e-p and p-e scattering times were calculated using a deformation potential model with the results for Ag films $$\tau_{ep} \approx 680 \text{ ns}/E^3$$

$$\tau_{pe} \approx 0.5 \text{ ns}/E_p \tag{30},$$

where $E_p$ is the phonon energy in Kelvin. Thus for a quasiparticle entering the trap from Al with $\Delta_1/k_B = \approx 2$ K, $\tau_{ee}^C$ is roughly 10 times shorter than $\tau_{ep}$ and therefore the energy of a trapped quasiparticle is distributed among the electrons of the trap. For higher energies where $\tau_{ee}^C$ and $\tau_{ep}$ are comparable (as is the case with quasiparticles entering from Nb), and phonon emission becomes competitive, much of the phonon, energy will still be retained in the electrons of the trap because the p-e scattering time $\tau_{ep}$ is small and very likely shorter than the phonon escape time $\tau_{esc}$. When the four scattering processes are integrated into a detailed model of quasiparticle thermalization, a thermalization efficiency greater than 90% is predicted. The model also predicts thermalization efficiencies greater than 90% when quasiparticles are trapped into a normal metal at temperatures near 1 K from larger gap superconductors such as Ta or Nb. These calculations indicate that devices can be built from a wide range of superconducting materials and operated over a considerable range of temperatures. We also note that these scattering rates have also been estimated for trapping from Al into W at its transition temperature, and a high electron thermalization efficiency has been demonstrated fro the Al—W system.

Applications

The invention has a wide variety of applications, such as (a) in microrefrigeration, (b) in particle and radiation detection, both in pulse mode and in continuous-wave (CW or bolometric) mode, (c) as a preamplifier for other types of low-temperature particle and radiation detectors and possibly other sensors, (d) as a general purpose analog electronics device, (e) as a switching device useful in digital electronics. Together with all these applications it has the capabilities to be applied to (f) acting as an amplifying interface device to bring low-level signals out from low-temperature cryostats to room-temperature electronics, and to (g) large scale integration of detector arrays and of analog and digital electronic circuits. Below, are a few examples of how devices based on the invention can be used.

a) Microrefrigeration

Figure 10:
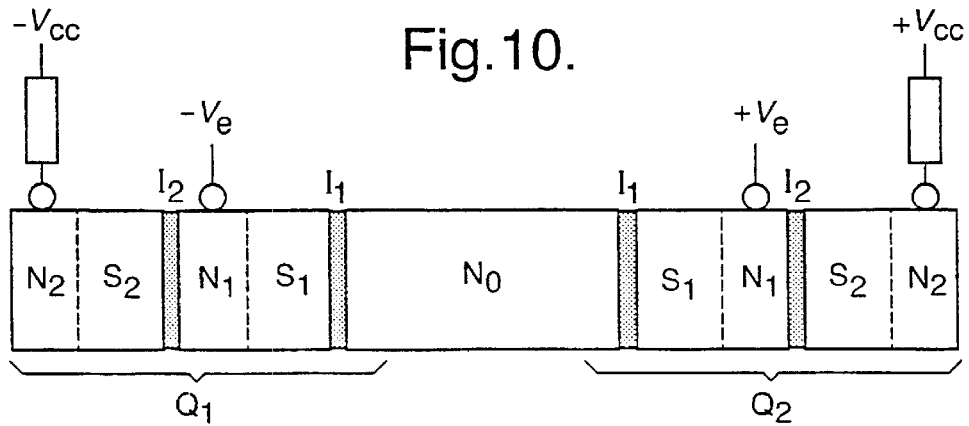
FIG. 10 shows an embodiment of the invention in which two devices are used to form a microrefrigerator.

Microrefrigeration using individual NIS junctions or two junctions in series has been proposed (for instance M Nahum, T M Eiles and J M Martinis, "Electronic microrefrigerator based on a normal-insulator-superconductor tunnel junction", Appl. Phys. Lett. 65, 2123 (1994)). Further the use of a normal metal trap on the superconductive electrode of an NIS junction in orderto improve the performance by removing quasiparticles injected into the superconductive electrode to (i) decrease the amount of back-tunnelling which heats up the normal metal electrode which one is trying to cool, and (ii) decrease the rate of quasiparticle recombination in the superconductive layer which leads to heating of the normal metal layer by phonons produced in the recombination process, is also known. However, with the present invention the normal layer is arranged to be the emitter electrode, and the cooling effect is amplified. This can lead to the production of lower temperatures or to the possibility of having a higher starting temperature and still achieve a low final temperature. A schematic of a refrigerator design using two such devices to cool the base region of nornal-metal $N_0$ is shown in FIG. 10. Although no bias is shown to the base region $N_0$, additional bias may be needed if the junctions are not identical.

b) Particle and Radiation Detection

The invention can be used in a number of ways for the detection of radiation, either in a bolometric mode or in an individual photon or particle counting mode. In both cases the radiation can be detected by being absorbed in the base electrode $N_0$ as shown schematically by-the incident power $P_b$ in FIG. 2 or the incident photon in FIG. 11(a). In this case the invention can produce additional cooling of $N_0$ which lowers its heat capacity, thus improving the sensitivity, and it also provides amplification of the signal. When used as a photon counting spectrometer this device is competitive with the SIS device using quasiparticle traps and the Gray effect as developed by the European Space Agency in collaboration with Oxford Instruments which is shown schematically in FIG. 11(b).

In an even simpler device, a 2-terminal SNIS device without a base electrode shown in FIG. 11(c), is also competitive. In both devices shown in FIGS. 11(b) and (c) individual photons break Cooper pairs in the superconductive region $S_1$ producing quasiparticles. In the device of FIG. 11(b) the excess quasiparticles are trapped in the superconductive trap $S_T$ where they tunnel in both directions across the tunnel barrier leading to charge amplification factors of up to 200. In the device of FIG. 11(c) the excess quasiparticles are trapped in the normal metal trap leading to current amplification by a factor $\beta_0$ which can be 20 or more with a reduced integration time. Further amplification by another factor of $\beta_0$ can be achieved by using a device with an absorbing superconductive film $S_0$ as part of the base electrode as shown in FIG. 11(d). Note that all of the devices of the invention in FIGS. 11(a), (c) and (d) need no applied magnetic field, whereas the device of FIG. 11(b) needs a field to suppress Josephson currents.

This is particularly important where arrays of detector devices are required. In such devices the individual junctions would typically be 20–100 $\mu$m square. It has proven difficult to find a field value which is optimum for an array of SIS devices, such as series-connected arrays of SIS junctions for phonon-mediated particle detection or trapping devices such as shown in FIG. 11(b). The absence of Josephson currents and Fiske steps in the present invention makes the biassing of the devices much easier. When the photons or other particles are absorbed in a $N_0$ layer the spectroscopic features are expected to be better because the statistics of the excitation spectrum are much higher: for a normal metal layer $N_0$ the energy required for an excitation is only $k_BT$ whereas for the SIS detector it is $\Delta$ and $\Delta$ is much greater than $k_BT$. Thus the invention can combine the spectroscopic quality of the NIS junction with internal amplification of the signal.

One problem in using a normal metal film as the particle or radiation absorber, is the much higher heat capacity of the normal metal as compared with a superconductor well below its transition temperature. For a normal metal absorber the heat capacity is proportional to the area times the thickness and to the absolute temperature. For the spectroscopy of X-rays the thickness has to be substantial, increasingly so for higher energy X-rays. However, for radiation in the range UV to infrared, only a very thin layer is needed. This is also the case for heavy particles such as biomolecular ions in a mass spectrometer, or even dust particles. For applications to X-ray spectroscopy where some thickness is needed, detector devices are forced to be of very small area. This problem can be somewhat mitigated by using microchannel focussing optics. A different solution is to absorb the X-rays (or other quanta or particles) in a thicker and/or larger area superconductive film $S_0$ which is attached to the normal metal base region $N_0$. This has already been illustrated in FIG. 11(d) where the normal metal base region $N_0$ acts as a quasiparticle trap for quasiparticles produced by energy depositions in $S_0$. The fact that absorption of energy in the superconductive layer $S_0$ produces fewer excitations than it would if absorbed directly in the normal metal lager $N_0$ is largely overcome by the generation of hot electrons in the normal metal trap as discussed previously. In other words, the $S_0N_0$ bilayer acts as an amplifier and there is additional internal amplification due to the effect of the invention. This idea can be extended to make large-area position-sensitive detectors based on difflusion of quasiparticles. Such devices could also be used as large area phonon detectors. One possibility for a detector which could be used for the detection of radiation or particles incident from the top, or phonons from the substrate, and which has position sensitivity is shown schematically in FIG. 12. Particles or radiation (or phonons from the substrate) are absorbed by Cooper-pair breaking in a superconductive film $S_0$. Some of the quasiparticles diffuse to $N_0$ (which is the base electrode) where they produce excited electrons by quasiparticle trapping. Two or more devices can be used to implement a position-sensitive strip detector (one end of which is illustrated here), or a 2-dimensional position-sensitive detector. Only one $S_0N_0IS_1N_1IS_2N_2$ device is illustrated here, but two or more could be connected to the $S_0$ absorber. The device shown here in an idealised form can be fabricated by suitable modifications of the known stacked-junction whole-wafer processing technique.

It should also be emphasised that each device of the invention acts as an isolating amplifier, and additional such devices can be used to act as buffers and multiplexers to read out arrays of similar detector devices.

Devices used for refrigeration can be combined with other devices used for particle and radiation detection. The refrigeration produces higher sensitivity and better spectroscopic resolution while the detector provides internal amplification. A device with these features is shown schematically in FIG. 13. The detector consists of the radiation or particle absorbing normal film $N_0$ which is fabricated on a thin membrane, for example of $Si_3N_4$ of low heat capacity and thermal conductance. Two devices $Q_1$ and $Q_2$ connected in series are used to cool the film while a third $Q_3$ is used as an integral part of the detector to amplify the signal.

Figure 13:
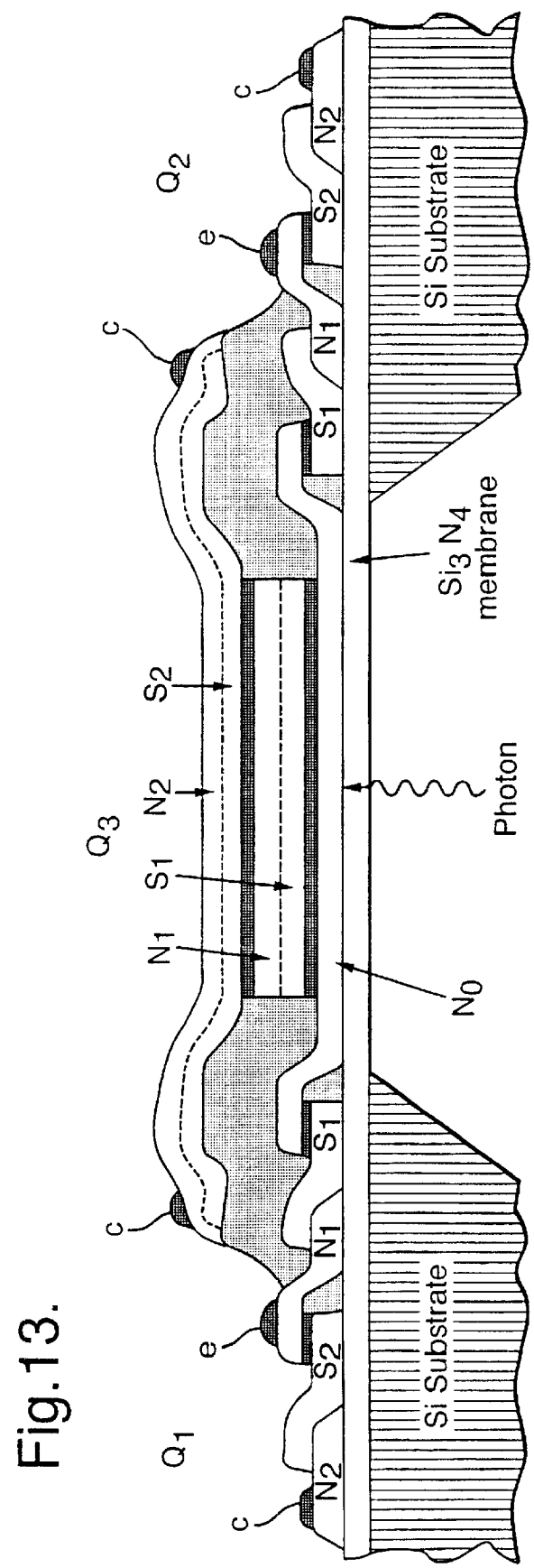
FIG. 13 illustrates schematically a further composite particle/radiation detector.

Another possibility for particle and radiation detection is that the film $N_0$ is a superconductive material and the devices $Q_1$ and $Q_2$ of FIG. 13 cool it such that it is just at its superconductive-to-normal transition temperature. In this case it acts as a transition edge sensor, and any change in its electron temperature is communicated to the further device structure $Q_3$ by tunnelling from $N_0$ to $S_1$. Since $N_0$ is right at its transition temperature there should be no Josephson currents or Fiske steps to complicate the biassing.

Semiconductors are often used to detect radiation in a particular frequency band. The detection mechanism is usually the creation of electron-hole pairs by the radiation which produces a current. It is therefore possible to use a thin semiconductor $S_m$ as the base electrode, as illustrated in FIG. 11(e), thus providing a selective radiation detector with internal amplification.

c) Preamplifiers for Particle and Radiation Sensors

Figure 14C:
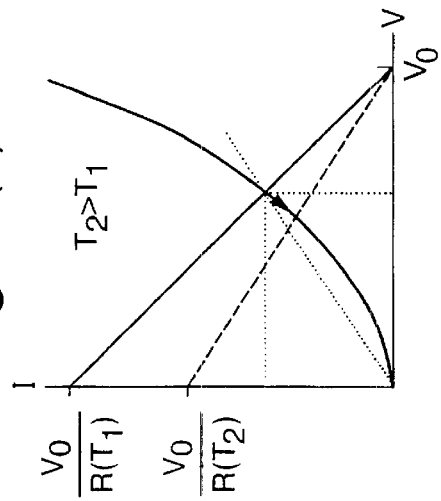
FIG. 14 illustrates use of an embodiment of the invention with a superconductive transition edge sensor with FIG. 14(a) illustrating a prior art circuit using a SQUID preamplifier, FIG. 14(b) showing a circuit schematic using an embodiment of the invention and FIG. 14(c) showing an input I/V characteristic of the circuit of FIG. 14(b)
Figure 14B:
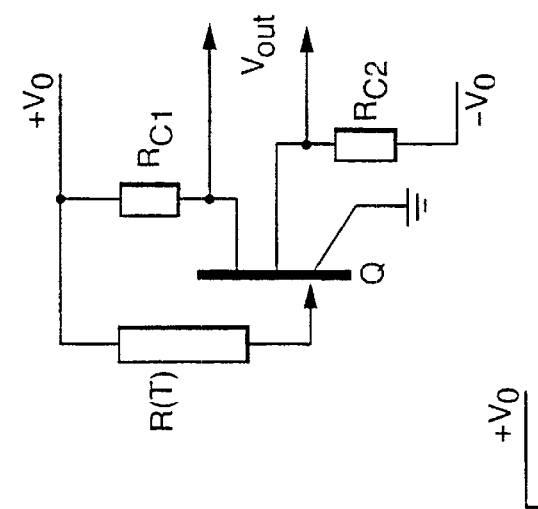
Figure 14A:
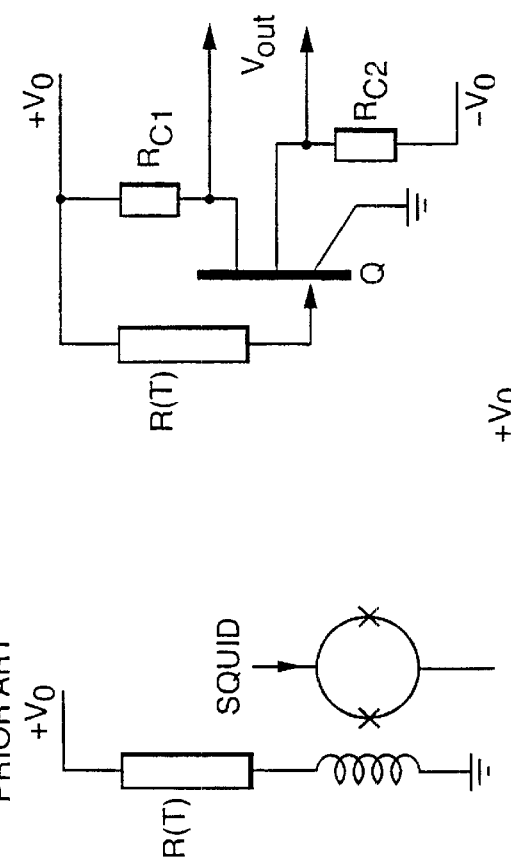

As described above, the invention can be used as an amplifying radiation and particle detector when the external stimulus is absorbed in the base electrode or some layer attached to it. The invention can also be used in conjunction with other types of sensor such as SIS junctions or TES sensors: In recent years the use of TES sensors has grown because they can be stably biassed because of electrothermal feedback (ETF) at constant voltage bias, and the current signal can be read out with a SQUID amplifier. A device of this invention can be used as a preamplifier instead of the expensive SQUID amplifier, and has the advantage that it can be operated at the same temperature as the TES. It maintains the advantages of ETF and can give a large voltage output with the double collector configuration. A simple circuit is shown in FIG. 14, where a comparison with the SQUID circuit is also made. FIG. 14(a) shows a circuit for readout of a TES of resistance R(T) with a SQUID preamplifier. The TES is voltage biassed while the SQUID is biassed at constant current. FIG. 14(b) shows a circuit for readout of a TES using a double-collector device Q according to this invention. FIG. 14(c) shows the input I/V characteristic of the device Q and load lines of the TES at two slightly different temperatures on the transition. The excursion of the operating point due to an excitation is shown by the arrow. Because of the shape of the I/V characteristic, negative electrothermal feedback is preserved. From eq. (10) and FIG. 6 it can be seen that $v_{out}/i_{in}$ values in the region of a few times $10^4$ V A$^{-1}$, achievable with SQUID readout, can be obtained with a much simpler stage based on the invention.

d) Analog Electronics Device

Figure 15:
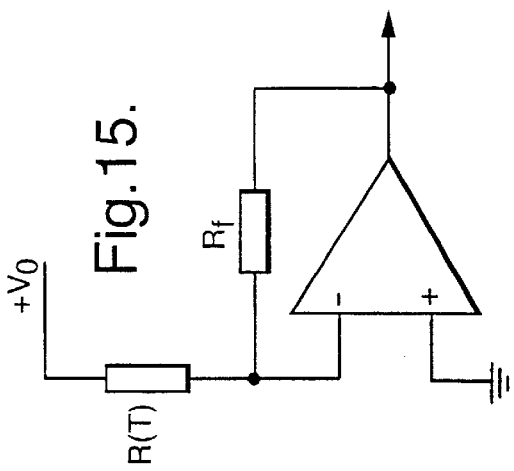
FIG. 15 schematically illustrates a low temperature sensor using an integrated circuit operational amplifier using embodiments of the invention.

As demonstrated already, the invention can provide devices which satisfy all the criteria for a 3-terminal, transistor-like device, and as shown above it can be used as an amplifier. More than one device can be used together to implement multi-transistor-like circuits such as the long-tailed pair, the current mirror, the cascode configuration, and even operational amplifiers. The invention gives tremendous possibilities because of the 4 plus 2 types of device shown symbolically in FIG. 8. All of these types could be made simultaneously in a superconductive electronics foundry process. For example, this would then allow the simple circuit of FIG. 14(b) to be replaced by the circuit of FIG. 15 which uses a feedback operational amplifier fabricated using devices of the invention.

In many similar applications the devices are used as sensors, for example as illustrated in FIG. 11(a)–(e), and these can be followed by or integrated into other devices used as circuit elements together with passive components. These sensors can also incorporate optical input coupling.

e) Disital Switching Circuits

The non-linear input characteristic and the non-linear collector characteristics shown in FIG. 5 indicate that devices embodying the invention can act as a switch, just as the bipolar transistor can. The design of switching circuits using the invention has the additional feature of choosing inverting or non-inverting output merely by the power supply connection. In addition, the double collector configuration can provide doubling of the output voltage swing, or it can provide fan-out capability.

In many switching applications, in particular computer processor logic, speed is of the essence. This is one of the prime reasons for the on-going development of electronic logic circuits based on superconductive Josephson junctions. The invention cannot compete with the latest versions of devices based on Josephson junctions for speed of operation. However, it can provide power gain combined with moderate speed switching capability and so has uses as a coupling or interface device between different computing or signal processing structures.

The time constant $\tau_{VB}$ plotted in FIG. 7, which was computed for a normal metal trap volume of 40 $\mu m^3$ and operation at a temperature of 0.1 K, gives only a very rough guide to digital switching times. It is a measure of the time for thermal recovery after an excitation under these conditions, and can be changed by several orders of magnitude by changing the operating temperature and the fabrication parameters of the device. For example, although the heat capacity of the normal metal electrode $N_1$ is proportional to $T_e$, the thermal conductance due to the e-p coupling is proportional to $T_e^4$, so the time constant due to purely thermal effects varies as $T_e^{-3}$. Thus, other things being equal, the purely thermal part of the $\tau_{VB}$ of ~100 ns plotted in FIG. 7 for aluminium at 0.1 K becomes 0.1 ns for niobium at 1 K. However, at higher temperatures the exponent 5 in eq. (5) eventually becomes unity, so there is an optimum temperature range which depends upon the normal metal used.

The other contribution to thermal conductance, namely that due to tunnelling is proportional to the electrical conductance of the collector-emitter junction. The tunnelling time can be minimised by making the normal metal trap electrode $N_1$ as thin as possible. This means that for high-speed operation the superconducting coherence length of the superconductive region $S_1$ should be small. In this regard the use of niobium or niobium nitride or a high temperature superconductor is very much better than aluminium. We have already discussed the use of impure or disordered superconductive materials to decrease the coherence length.

Apart from its potential use as a complement to Josephson junction devices, it is possible, as already mentioned, to make the base electrode of the device a superconductor $S_0$, as illustrated in FIG. 11(e), thereby incorporating a Josephson junction $J_1$ as an integral part of the structure. When $J_1$ is in the zero-voltage state there is no quasiparticle injection into the trap $N_1$ and the current through $J_2$ is small. When $J_1$ is switched to the resistive state a quasiparticle current flows thereby increasing the current through $J_2$. Such a device can act as an interface circuit or as a fan-out for Josephson junction logic. It is also possible to use a magnetic field to suppress Josephson effects in which case this structure act like a SIS detection device with internal amplification. This can be useful in some quasiparticle mixer applications.

Large Scale Integration

The thin films which make up the structures and the fabrication steps are very similar to, if not identical with, those used to make Josephson junction and other superconductive devices. Also, the films and structures are similar to those used in modern semiconductor integrated circuits. Foundry style fabrication procedures for superconductive electronics have been perfected by a number of industries. Large scale integration of the devices is therefore possible, including their incorporation into Josephson junction logic circuits.

What is claimed is:

1. A superconductive tunnel junction device comprising a first superconductive region ($S_1$) in contact with a first normal region ($N_1$), wherein the potential energy of quasi-particles from the first superconductive region ($S_1$) relaxing into the first normal region ($N_1$) is converted into an increased number of charge carriers excited above the Fermi level of the first normal region ($N_1$).

2. A superconductive tunnel junction device according to claim 1 wherein the first superconductive region ($S_1$) comprises two separate superconductive regions, quasiparticles from each of the separate regions relaxing into two separate first normal regions ($N_1$).

3. A superconductive tunnel junction device according to claim 1, further comprising a second superconductive region ($S_2$) separated from the first normal region ($N_1$) by an insulating tunnel barrier ($I_2$) to form a tunnel junction ($J_2$) across which said charge carriers tunnel into the second superconductive region ($S_2$) to form quasiparticles therein.

4. A superconductive tunnel junction device according to claim 3 wherein the second superconducting region ($S_2$) and the first normal region ($N_1$) are relatively electrically biased so that the top of the energy gap of the second superconductive region ($S_2$) is just above the Fermi level of the first normal region ($N_1$).

5. A superconductive tunnel junction device according to claim 3 wherein the second superconductive region ($S_2$) forms an electrode of the device.

6. A superconductive tunnel junction device according to claim 3 further comprising a further normal region ($N_2$) in contact with the second superconductive region ($S_2$) for receiving quasiparticles from the second superconductive region ($S_2$).

7. A superconductive tunnel junction device according to claim 3 wherein the second superconductive region ($S_2$) comprises two separate superconductive regions each receiving charge carriers tunnelling from the first normal region ($N_1$).

8. A superconductive tunnel junction device according to claim 3 wherein at least one of the superconductive regions is selected from aluminium, niobium and niobium nitride and at least one of the normal regions is selected from molybdenum, tungsten, magnesium, calcium, copper, palladium, silver and gold.

9. A superconductive tunnel junction device according to claim 3 in which at least one of the superconductive regions is impure or disordered.

10. A superconductive tunnel junction device according to claim 1, further comprising a base region ($N_0$, $I_1$) for injecting quasiparticles into the first superconductive region ($S_1$).

11. A superconductive tunnel junction device according to claim 10 wherein the base region comprises a second normal region ($N_0$), separated from the first superconductive region ($S_1$) by an insulating tunnel barrier ($I_1$), and electrically biased such that charge carriers excited above its Fermi level tunnel through the tunnel barrier to form quasiparticles in the first superconductive region ($S_1$).

12. A superconductive tunnel junction device according to claim 11 wherein the first normal region ($N_1$) and second superconductive region ($S_2$) form emitter and collector electrodes of the device and the second normal region ($N_0$) forms a base electrode of the device which controls current flow between the collector and emitter electrodes.

13. A analogue electrical signal amplifier comprising a superconductive tunnel junction device according to claim 12, said base or emitter electrode forming an input to receive an electrical signal to be amplified, and the output appearing across the collector and emitter electrodes or across the collector and base electrodes.

14. A digital switching device comprising a superconductive tunnel junction device according to claim 12, in which a signal applied to the base electrode switches the current flowing through the collector and emitter.

15. The superconductive tunnel junction device according to claim 10 wherein the base region comprises two separate regions, each for injecting quasiparticles into the first superconductive region ($S_1$).

16. A superconductive tunnel junction device according to claim 11 wherein the base region further comprises a third superconductive region ($S_0$) separated from the contact with the second normal region ($N_0$), quasiparticles generated in the third superconductive region ($S_0$) relaxing into the second normal region ($N_0$) to convert their potential energy into an increased number of charges carriers excited above the Fermi level.

17. A particle/radiation detector comprising a superconductive tunnel junction device according to claim 16 wherein the third superconductive region ($S_0$) forms a detector element in which received particles or radiation form quasiparticles which relax into the second normal region ($N_0$) to cause excitation of charge carriers which tunnel through the insulating tunnel junction barrier ($I_1$).

18. A particle/radiation detector comprising a superconductive tunnel junction device according to claim 6, wherein the second normal region ($N_0$) forms a detector element in which received particles or radiation cause excitation of charge carriers which tunnel through the insulating tunnel junction barrier.

19. A particle/radiation detector according to claim 18 for detecting photons, X-rays, phonons, biomolecular ions or dust particles.

20. A superconductive tunnel junction device according to claim 10 wherein the base region comprises a third superconductive region ($S_0$) separated from the first superconductive region ($S_1$) by an insulating tunnel junction barrier ($I_1$).

21. A superconductive tunnel junction device according to claim 20 wherein the Josephson current between the first and third superconductive regions is suppressed by application of a magnetic field.

22. A particle/radiation detector comprising a superconductive tunnel junction device according to claim 20 wherein the third superconductive region ($S_0$) forms a detector element in which received particles or radiation form quasiparticles which tunnel through the insulating tunnel junction barrier ($I_1$).

23. A superconductive tunnel junction device according to claim 10 wherein the base region comprises a semiconductor region ($S_m$) separated from the first superconductive region ($S_1$) by an insulating tunnel junction barrier ($I_1$).

24. A particle/radiation detector comprising a superconductive tunnel junction device according to claim 23 wherein the semiconducting region ($S_m$) forms a detector element in which received particles or radiation cause excitation of charge carriers which tunnel through the insulating tunnel junction barrier ($I_1$).

25. A microrefrigerator comprising a superconductive tunnel junction device according to claim 1.

26. A microrefrigerator according to claim 25 wherein there are two superconductive tunnel junction devices arranged with their first superconductive regions ($S_1$) separated from a normal cooling region ($N_0$) by insulating tunnel junction barriers ($I_2$), wherein tunnelling into the first superconductive regions ($S_1$) of charge carriers excited above the Fermi level of the normal cooling region ($N_0$) causing cooling of the normal cooling region ($N_0$).

* * * * *